United States Patent
Savastiouk et al.

(10) Patent No.: US 7,241,641 B2
(45) Date of Patent: Jul. 10, 2007

(54) ATTACHMENT OF INTEGRATED CIRCUIT STRUCTURES AND OTHER SUBSTRATES TO SUBSTRATES WITH VIAS

(75) Inventors: Sergey Savastiouk, San Jose, CA (US); Sam Kao, San Mateo, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 11/253,492

(22) Filed: Oct. 19, 2005

(65) Prior Publication Data
US 2006/0040423 A1    Feb. 23, 2006

Related U.S. Application Data

(60) Division of application No. 10/798,540, filed on Mar. 10, 2004, which is a continuation-in-part of application No. 10/739,788, filed on Dec. 17, 2003, now Pat. No. 7,049,170.

(51) Int. Cl.
*H01L 21/44* (2006.01)

(52) U.S. Cl. ............... 438/106; 438/106; 438/107; 438/108; 257/E21.511

(58) Field of Classification Search ............. None
See application file for complete search history.

(56) References Cited

U.S. PATENT DOCUMENTS

| 5,391,514 A | 2/1995 | Gall et al. |
| 5,611,140 A * | 3/1997 | Kulesza et al. ............ 29/832 |
| 6,163,456 A | 12/2000 | Suzuki et al. |
| 6,165,885 A | 12/2000 | Gaynes et al. |
| 6,175,158 B1 | 1/2001 | Degani et al. |
| 6,190,940 B1 | 2/2001 | DeFelice et al. |

(Continued)

FOREIGN PATENT DOCUMENTS

DE    195 31 158 A1    2/1997

(Continued)

OTHER PUBLICATIONS

Ekstrom; Bjorn "Thin Film Silicon Substrates For Lead Frame Packages" Advancing Microelectronics—May/Jun. 2003, pp. 6-7.

(Continued)

*Primary Examiner*—Walter Lindsay, Jr.
*Assistant Examiner*—Kyoung Lee
(74) *Attorney, Agent, or Firm*—Michael Shenker; MacPherson Kwok Chen & Heid LLP

(57) ABSTRACT

Vias (210, 210B) are formed in a surface of a substrate. At least portions of contact pads (139, 350) are located in the vias. Contact pads (150, 340) of an integrated circuit structure are inserted into the vias and attached to the contact pads (139, 350) of the substrate. The vias provide a strong, reliable mechanical and electrical connection. A via may expose not only a contact pad (350) in the substrate but also a surrounding region. Solder (930) wets the contact pad better than the surrounding region, resulting in a stronger solder joint and better electrical conductivity. Alternatively, the contact may include multiple conductive layers (910.1, 910.2), with the top layer (910.2) being more solder wettable than the bottom layer (910.1) and the top layer covering only a portion of the bottom layer.

27 Claims, 13 Drawing Sheets

U.S. PATENT DOCUMENTS

| | | | |
|---|---|---|---|
| 6,322,903 B1 * | 11/2001 | Siniaguine et al. | 428/617 |
| 6,498,074 B2 | 12/2002 | Siniaguine et al. | |
| 6,498,381 B2 | 12/2002 | Halahan et al. | |
| 6,661,088 B1 | 12/2003 | Yoda et al. | |
| 6,903,443 B2 | 6/2005 | Farnworth et al. | |
| 2001/0019178 A1 * | 9/2001 | Brofman et al. | 257/780 |
| 2002/0036340 A1 | 3/2002 | Matsuo et al. | |
| 2002/0048916 A1 | 4/2002 | Yangida | |
| 2002/0074637 A1 | 6/2002 | McFarland | |
| 2002/0175421 A1 | 11/2002 | Kimura | |
| 2003/0047798 A1 | 3/2003 | Halahan | |
| 2003/0080437 A1 | 5/2003 | Gonzalez et al. | |
| 2003/0116859 A1 | 6/2003 | Hashimoto | |
| 2003/0199123 A1 | 10/2003 | Siniaguine | |
| 2004/0087057 A1 * | 5/2004 | Wang et al. | 438/106 |

FOREIGN PATENT DOCUMENTS

| | | |
|---|---|---|
| EP | 0 193 128 | 9/1986 |
| JP | 08-236579 | 9/1996 |
| WO | WO 01/45476 | 6/2001 |

OTHER PUBLICATIONS

200mm Wafer Fab Strand Interconnect, Partner for High Performance Electronics.

Chapter 7: Wedge and Double Cantilever Beam Tests on a High Temperatue Melt Processable Polymide Adhesive, TPER-BPDA-PA, pp. 221-242.

Design Notes: Understanding Ball Grid Array Packages Electronics by Design, www.electronicsbydesign.com.au, issue 1997.10, pp. 1-4.

Flip Chip Bonding in Practice Issue No. 7, Sep. 2001, The Micro Circuit Engineering Newsletter.

Gektin, Vadim; Bar-Cohen, Avram; Witzman, Sorin "Coffin-Mason Based Fatigue Analysis of Underfilled DCAs," 1998 IEEE Transactions on Components, Packaging, and Manufacturing Technology, Part A, vol. 21, No. 4, Dec. 1998, pp. 577-584.

Gilleo, Ken "Substrates for Flip Chips" "Flip Chips Technology" in Area Array Packaging Handbook—Manufacturing and Assembly; K Gillio, Editor; The McGraw-Hill Companies, Inc., New York, NY.

Guenin, Bruce M. "The Many Flavors of Ball Grid Array Packages" Electronics Cooling, Feb. 2002, pp. 1-7.

HPMX-5001: Demonstration Circuit Board: Application Brief 102 Hewlett Packard, pp. 1-10.

Introduction to Printed Wiring Boards Netpack Education Pool, p. 1-18.

Jasper, Jorg "Gold or Solder Chip Bumping, the choice is application dependent" Chip Interconnection, EM Marin, pp. 1-4.

Jordan, Jerry "Gold Stud Bump In Flip-Chip Applicatins," 2002 Palomar Technologies, Inc.

Lu, H. and Bailey, C. "Predicting Optimal Process Conditions for Flip-Chip Assembly Using Copper Column Bumped Dies" School of Computing and Mathematical Sciences, 2002 IEEE, 2002 Electronics Packaging Technology Conference, pp. 338-343.

Maiwald, Werner "soldering SMD's Without Solder Paste" http://www.midwestpcb.com/sales/Kehoe/maiwald.htm.

Moon, K.W.; Boettinger, W.J.; Kattner, U.R.; Biancaniello, F.S.; Handwerker, C.A. "The Ternary Eutectic of Sn-Ag-Cu Colder Alloys" Metallury Division, Materials Science and Engineering Laboratory NIST Gaithersburg, MD 20899 USA.

Painaik, Mandar; and Hurley, Jim "Process Recommendations for Assemby of Flip Chips Using No-Flow Underfill" Semiconductor Products, Technical Bulletin, www.cooksonsemi.com.

Pang, John H.L.; Chong, D.Y.R.; Low T.H. "Thermal Cycling Analysis of Flip-Chip Solder Joint Reliability" IEEE Transactions on Components and Packaging Technologies, vol. 24, No. 4, Dec. 2001, pp. 705-712.

Perfecto, Eric; Lee, Kang-Wook; Hamel, Harvey; Wassick, Thomas; Cline, Christopher; Oonk, Matthew; Feger, Claudius; McHerron, Dale, "Evaluation of Cu Capping Alternatives for Polymide-Cu MCM-D" IEEE, 2001 Electronic Components and Technology Conference.

Productions Qualification Report: Select Qual B: Strand Substrate on MCM MQFP Qual Amkor Technology, Date Released: Jun. 14, 2002.

Solving Soldering Hierarchy Problems by Metallurgy and Design IBM Technical Disclosure Bulletin, IBM Corp. New York, US, vol. 33, No. 8, Jan. 1991, pp. 298-299, XP000106967, ISSN: 0018-8689.

Sperling, Ed; Electronics News, Sep. 17, 2003.

Staychip; 2078E No-Flow Fluxing Underfill; For Solding Sn/Pb eutectic solder bumps to common pad metallizations Preliminary Technical Bulletin Semiconductor Products, Technical Bulletin; Cookson Electronics.

Strand is Closing the Enterprise Strand Interconnect AB, Viggengatan5, SE-602 09 Norrkoping Sweden, www.strandinter.se.

Technical Data Sheet: No-Clean Pin-Probe Testable Solder Paste: NC253 www.aimsolder.com.

Tran, S.K.; Questad, D.L.; Sammakia, B.G. "Adhesion Issues in Flip-Chip on Organic Modules," 1998 InterSociety Conference on Thermal Phenomena, pp. 263-268.

U.S. Appl. No. 10/739,707, entitled "Packaging Substrates For Integrated Circuits and Soldering Methods," filed on Dec. 17, 2003.

U.S. Appl. No. 10/798,540, entitled "Attachment of Integrated Circuit Structures and Other Substrates to Substrates with Vias," filed on Mar. 10, 2004.

Wang, C.H.; Holmes, A.S.; Gao, S. "Laser-Assisted Bump Transfer for Flip Chip Assembly," 2000 IEEE Int'l Symp on Electronic Materials & Packaging, pp. 86-90.

Wang, Tie; Tung, Francisca; Foo, Louis; and Dutta, Vivek "Studies on A Novel Flip-Chip Interconnect Structure—Pillar Bump" Advanpack Solutions Pte Ltd, 2001 IEEE, 2001 Electronic Components and Technolgoy Conference.

www.flipchips.com/tutorial27.html "Flipchips: Tutorial 27, Shaping Gold Stud Bumps" pp. 1-8.

Zama, Satoru; Baldwin, Daniel F; Hikami, Toshiya; Murata, Hideaki "Flip Chip Interconnect Systems Using Wire Stud Bumps and Lead Free Solder," 2000 IEEE Electronic Components and Technology Conference, pp. 1111-1117.

* cited by examiner

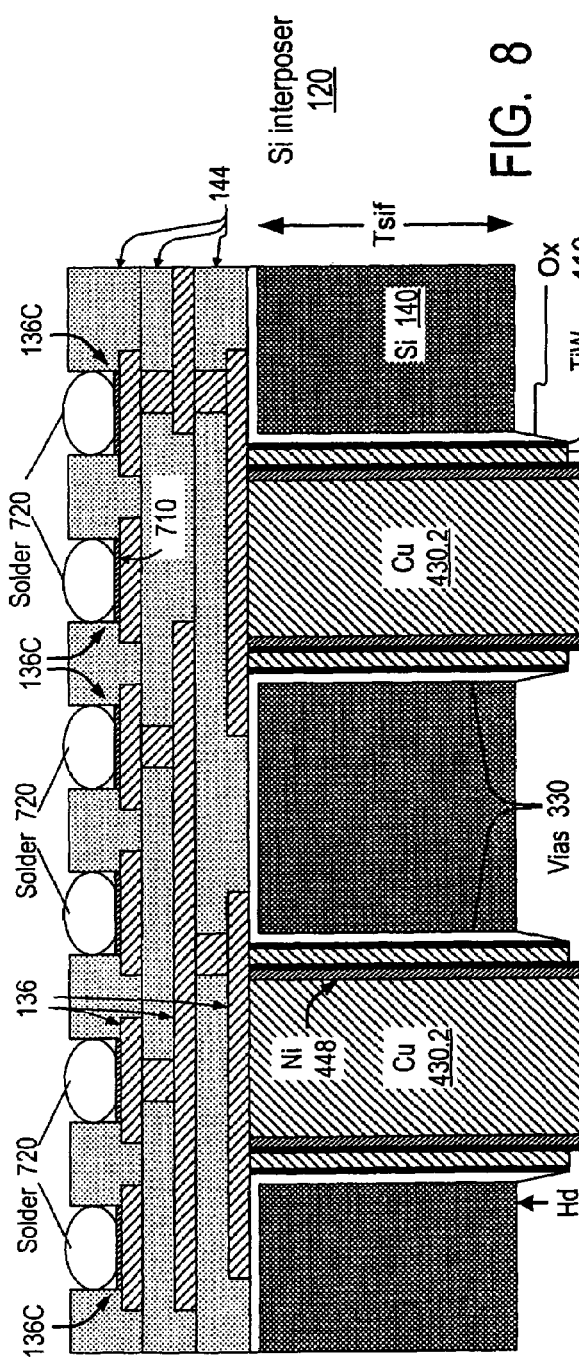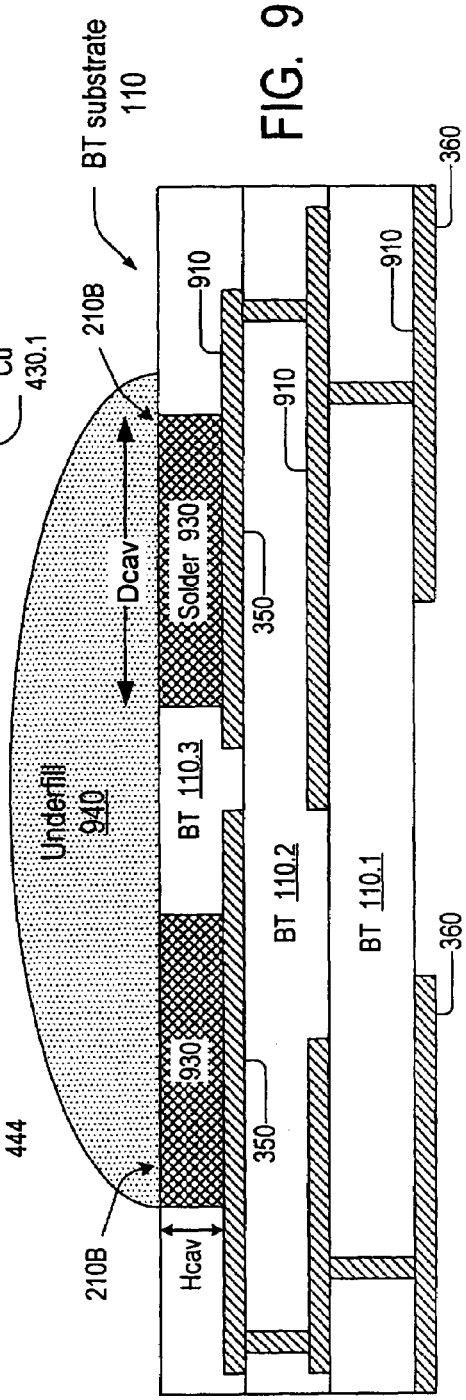

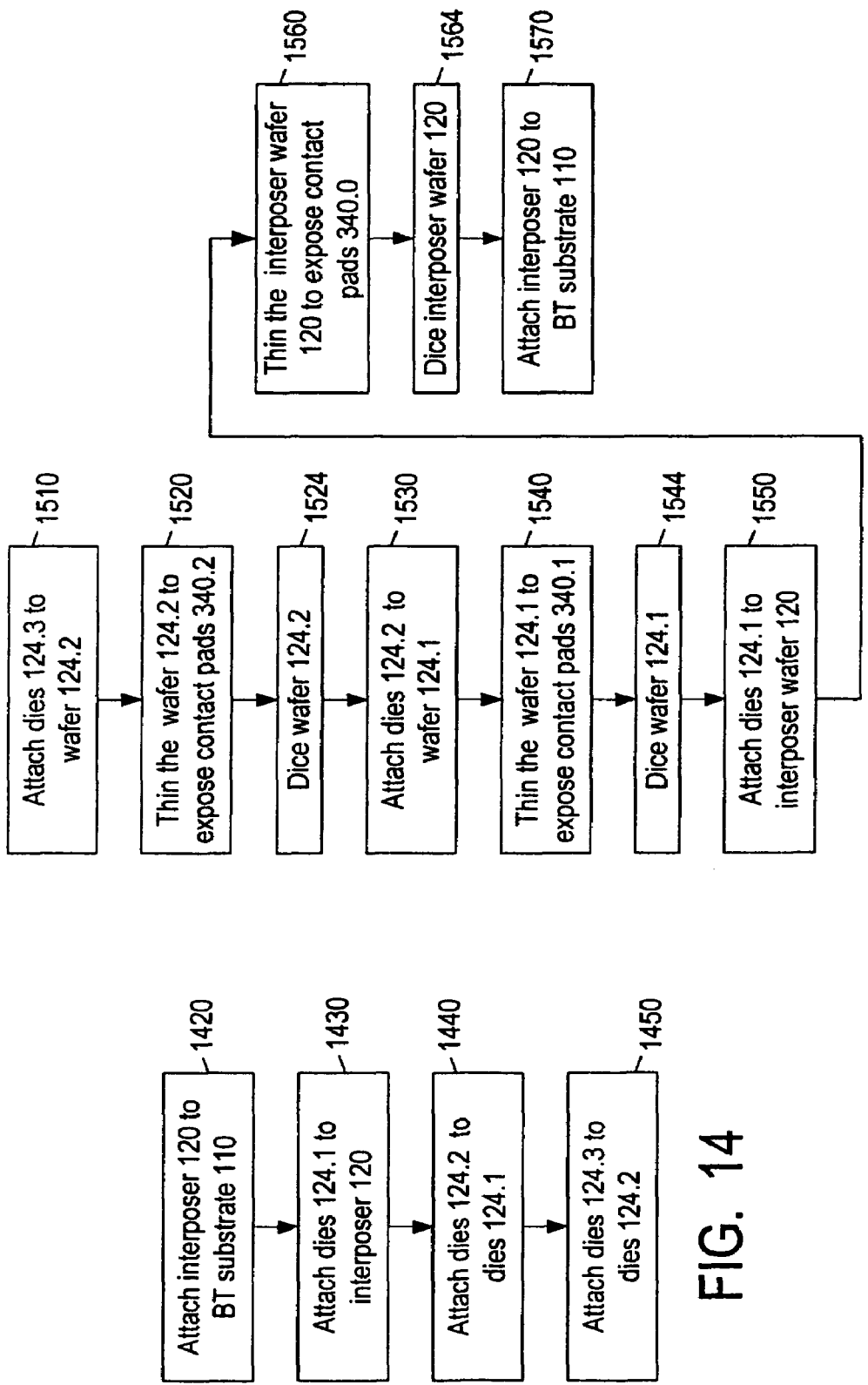

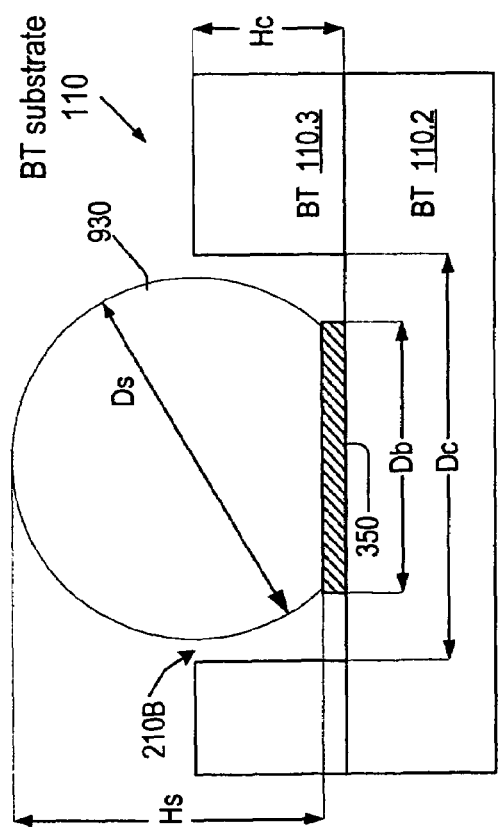
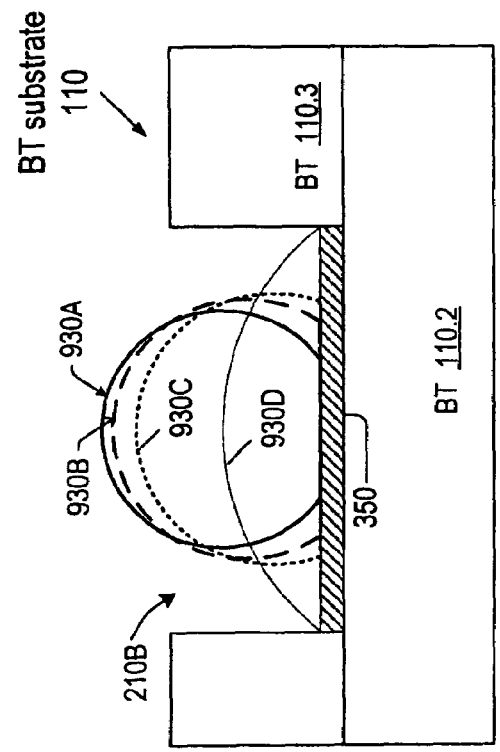
FIG. 18
FIG. 19

ATTACHMENT OF INTEGRATED CIRCUIT STRUCTURES AND OTHER SUBSTRATES TO SUBSTRATES WITH VIAS

CROSS REFERENCE TO RELATED APPLICATIONS

The present application is a division of U.S. patent application Ser. No. 10/798,540 filed on Mar. 10, 2004 by S. Savastiouk et al., entitled "ATTACHMENT OF INTEGRATED CIRCUIT STRUCTURES AND OTHER SUBSTRATES TO SUBSTRATES WITH VIAS", incorporated herein by reference, which is a continuation-in-part of U.S. patent application Ser. No. 10/739,788 filed on Dec. 17, 2003 now U.S. Pat. No. 7,049,170 by S. Savastiouk et al., entitled "INTEGRATED CIRCUITS AND PACKAGING SUBSTRATES WITH CAVITIES, AND ATTACHMENT METHODS INCLUDING INSERTION OF PROTRUDING CONTACT PADS INTO CAVITIES", incorporated herein by reference.

BACKGROUND OF THE INVENTION

The present invention relates to attachment of integrated circuits to other substrates.

Integrated circuit dies ("chips") can be attached to a lead frame and then packaged in a ceramic or plastic carrier. The leads of the lead frame can then be soldered to a printed circuit board (PCB). Alternatively, the chip can be soldered directly to the PCB ("flip chip" packaging). The flip chip packaging reduces the package size and shortens the electrical connections between the die and the PCB. FIG. 1 illustrates a chip 124 flip-chip attached to a PCB 130. The chip is attached face down, with its contact pads 137 connected to contact pads 139 of the PCB.

In the manufacturing process, contact pad metal layer 137 (the layer that provides the contact pads) is deposited and patterned over the chip's silicon substrate 140. A passivation dielectric layer 147 is formed on layer 137. Openings are formed in dielectric 147 to expose the contact pads 137. As a result, contact pads 137 are recessed into the chip's surface. To connect the contact pads 137 to the PCB, protruding metal bumps 150 are formed on the contact pads. Bumps 150 are bonded to PCB contact pads 139 with solder, an adhesive, or by thermal or thermosonic compression.

Bumps 150 can themselves be made of solder. The chip is placed on the PCB with bumps 150 on pads 139, and solder 150 is reflowed to form solder joints. This attachment is mechanically strong and reliable in the presence of thermal stresses, but the solder bumps are difficult to scale down as contact pads 137 become smaller and the pitch between the pads 137 is reduced. As the solder bump sizes decrease to accommodate the smaller contact pads and pitches, the solder joints become mechanically and thermally weaker. Also, the solder ball (solder bump) size defines the standoff distance between the chip 124 and PCB 130. If the standoff is too small, there will be increased fatigue stresses on the solder joints during thermal cycling. In addition, there is a greater possibility of undesirable residues remaining between the chip 124 and the PCB and causing some degradation.

Bumps 150 can also be made without solder, e.g. from copper (Cu) or gold (Au), to obtain better scalability. See S. Zama et al., "Flip Chip Interconnect Systems Using Wire Stud Bumps and Lead Free Solder", 2000 Electronic Components and Technology Conference, pages 1111–1117 (available from IEEE); C. H. Wang et al., "Laser-Assisted Bump Transfer for Flip Chip Assembly", 2000 International Symposium on Electronic Materials & Packaging, pages 86–90 (available from IEEE), both incorporated herein by reference. A combination of solder and copper has also been used. More particularly, a "copper pillar" can be plated on contact pads 137, then solder is plated on the copper pillar. See H. Lu et al., "Predicting Optimal Process Conditions for Flip-Chip Assembly Using Copper Column Bumped Dies", 2002 Electronics Packaging Technology Conference, pages 338–343 (available from IEEE); Tie Wang et al., "Studies on a Novel Flip-Chip Interconnect Structure—Pillar Bump", 2001 Electronic Components and Technology Conference (available from IEEE), both incorporated herein by reference.

Improved integrated circuit attachment techniques are desirable.

SUMMARY

This section summarizes some features of the invention. Other features are described in the subsequent sections. The invention is defined by the appended claims which are incorporated into this section by reference.

In some embodiments of the present invention, cavities are formed in the PCB, and the integrated circuit bumps are inserted into the cavities. For example, in FIG. 2, cavities 210 are formed in the top surface of PCB 130. At least a portion of each contact PCB pad 139 is located in the corresponding cavity. Bumps 150 are inserted into the cavities and attached to contact pads 139. Bumps 150 may be solderless bumps, e.g. they may be copper columns, gold wires, or some other kind of bumps, known or to be invented. Bumps 150 may also include solder. Bumps 150 can be attached to PCB contact pads 139 with solder, a conductive or anisotropic adhesive, by thermal or thermosonic compression, or some other technique, known or to be invented. For example, in some embodiments, solder paste or an adhesive (not shown) are deposited in cavities 210, then the die 124 is placed on the PCB with the bumps 150 inserted into the cavities.

In some embodiments, cavities 210 increase the mechanical strength of the structure. The structure becomes stronger against lateral forces (including lateral stresses caused by thermal expansion). Also, the amount of solder or adhesive can be increased by increasing the depth of cavities 210 without increasing the lateral size of the structure. Improved scalability is therefore provided.

In addition, if bumps 150 are attached with solder or a conductive or anisotropic adhesive, the size uniformity requirements for bumps 150 are relaxed. If the bumps are not uniform in size, the shorter bumps will still provide a reliable electrical connection to contacts 139 as long as there is a reliable electrical connection between the bumps and the solder or adhesive in cavities 210.

In FIG. 2, an optional conductive film 220 (e.g. metal) is formed on the bottom and sidewalls of each cavity 210. Film 220 is believed to improve the strength and the electrical conductivity of the bond between bumps 150 and contact pads 139. Film 220 is not necessary however.

Bumps 150 can be thought of as "contact pads", and the invention is applicable to any protruding contact pads and not necessarily the protruding pads formed by bumping a die. For example, protruding contact pads can be formed on a die by removing the die material to expose metal features, as described in U.S. Pat. No. 6,322,903 issued Nov. 27, 2001 to Siniaguine et al. and incorporated herein by reference.

In some embodiments, layer 220 is absent, and a cavity 210 exposes not only the contact pad 139 but also a surrounding dielectric region in substrate 130. The solder (not shown) wets the contact pad 139 better than the surrounding region, so more solder gathers near the bump 150, and the solder reaches up higher along the surface of bump 150. This is believed to provide a stronger solder joint and better electrical conductivity at least in some embodiments. Alternatively, the contact pad 139 or layer 220 may include multiple conductive layers, with the top layer being more solder wettable than the bottom layers and the top layer covering only a portion of the bottom layers. The solder will preferentially wet the more solder wettable layer, gathering closer to bump 150 and reaching up higher.

The invention is not limited to the embodiments discussed in this section. For example, cavities 210 can be replaced by through vias (through holes) that pass through the PCB 130. Contacts 139 can be metal layers on the sidewalls of the through vias. The integrated circuit structure 124 can be a wafer rather than a die. PCB 130 can be replaced with a ball grid array substrate (BGA) or some other packaging substrate, e.g. a silicon interposer. PCB 130 can also be replaced with another integrated circuit structure (a die or a wafer). Other features and advantages of the invention are described below. The invention is defined by the appended claims.

BRIEF DESCRIPTION OF THE DRAWINGS

FIGS. 4–8 show vertical cross sections of integrated circuits in the process of fabrication for attachment according to embodiments of the present invention.

FIG. 9 shows a vertical cross section of a BT substrate fabricated according to an embodiment of the present invention.

FIGS. 14, 15 are flowcharts of an integrated circuit packaging processes according to embodiments of the present invention.

FIGS. 18, 19 illustrate possible shapes of solder for the embodiments of FIGS. 16A, 16B, 17.

DESCRIPTION OF SOME EMBODIMENTS

The embodiments described in this section illustrate but do not limit the invention. The invention is not limited to particular materials, process steps, or dimensions. The invention is defined by the appended claims.

Figure 2:
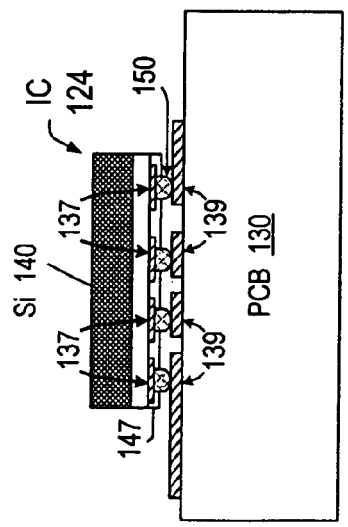
FIGS. 2, 3 show vertical cross sections of integrated circuits attached to substrates according to embodiments of the present invention.
Figure 3:
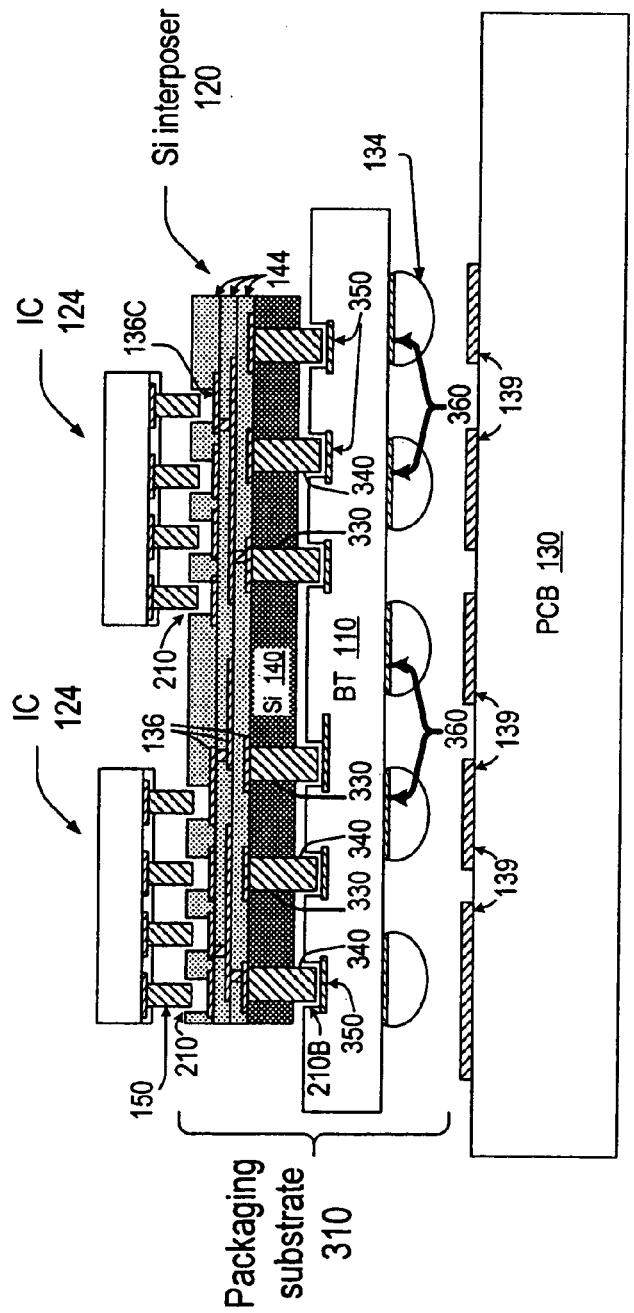

FIG. 3 illustrates another integrated circuit packaging structure. Integrated circuit packaging substrate 310 is an intermediate substrate that provides an interconnection between dies 124 and PCB 130. Substrate 310 includes two intermediate integrated circuit packaging substrates 110, 120. Substrate 120 is a silicon interposer attached to BT substrate 110, and thus is itself a semiconductor integrated circuit. The attachment is made as described above in connection with FIG. 2. More particularly, cavities 210B (also called vias or openings herein) are formed in the top surface of BT substrate 110. Protruding contact pads 340 of interposer 120 are inserted into the cavities.

Dies 124 are attached to interposer 120 as in FIG. 2. More particularly, cavities 210 are formed in the top surface of the interposer, and the dies' bumps 150 are inserted into these cavities. BT substrate 110 is attached to PCB 130 in a conventional manner. More particularly, solder balls 134 are attached to contact pads 360 on the bottom surface of BT substrate 110, and the solder balls are later reflowed to solder the contact pads 360 to PCB contact pads 139. These features are not limiting. For example, in some embodiments, the cavities are used to attach the dies 124 to interposer 120 but the attachment of interposer 120 to BT substrate 110 is performed without cavities. In other embodiments, the cavities are used to attach the interposer 120 to BT substrate 110, but the attachment of dies 124 to interposer 120 is performed without cavities. In other embodiments, the cavities are used to attach one but not both dies 124 to interposer 120. Also, the cavities can be used to attach some but not all of the a single die's contact pads to the interposer, or some but not all of the interposer's contact pads 340 to BT substrate 110.

Silicon interposer 120 includes metal layers 136 formed over silicon substrate 140. Substrate 140 has substantially planar top and bottom surfaces, and is quite thin. In some embodiments, the planarity of substrate 140 is suitable for fine geometry photolithography (finer than possible with BT and FR4 substrates). The thickness of substrate 140 can be 100 µm or less (50 µm to 35 µm thickness values believed to be achievable, and smaller values may be possible). Layers 136 provide interconnect lines and may also provide power and ground planes, resistors, inductors, capacitor plates for decoupling capacitors and other capacitor types, and possibly other elements, known or to be invented. Layers 136 can be separated from each other, and from the substrate, by dielectric layers 144. Layers 136 contact each other and the silicon substrate through openings in the dielectric layers. Layers 136 can also be formed directly on the silicon substrate if desired. Layers 136 provide contact pads 136C at the top surface of the interposer. At least a portion of each contact pad 136C is located in a corresponding cavity 210.

These features are exemplary and not necessary. For example, silicon substrate 140 can be thicker than described above, and its top and bottom surfaces do not have to be planar.

In the embodiment of FIG. 3, silicon substrate 140 includes metalized through-silicon vias 330 that pass between the top and bottom surfaces of substrate 140. Conductive paths are provided from contact pads 136C at the top of the interposer to contact pads 340 at the bottom of the interposer through the vias 330. Contact pads 340 protrude out of vias 330. Contact pads 340 are attached to contact pads 350 at the top surface of BT substrate 110.

Interconnects (not shown) in BT substrate 110 connect the contact pads 350 to contact pads 360 at the bottom surface of substrate 110. Solder balls 134 are formed on pads 360 by conventional techniques for attachment to PCB 130.

The size and spacing (pitch) of contact pads 136C on interposer 120 matches the size and the pitch of the contact pads on dies 124. If dies 124 are silicon integrated circuits, their CTE (coefficient of thermal expansion) matches the CTE of the interposer, so the pitch of contact pads 136C can be small because the low thermal stresses at the interface between the dies and the interposer make it unnecessary to use large bumps 150 as would be desirable for a strong mechanical connection. The contact pads 340 on the bottom of the interposer match the top contact pads 350 of BT substrate 110. For some fabrication technologies, the minimum dimensions are as shown in the following Table 1. The dimensions can typically be reduced if more expensive technologies are used.

TABLE 1

| Contacts | Minimum pitch | Solder ball diameter | Solder ball height |
|---|---|---|---|
| Contact pads 136C | 125 µm | 75 µm | 60 µm |
| Contact pads 340, 350 | 254 µm | 150 µm (solder balls, not shown, joining pads 340 to 350) | 120 µm |
| Contact pads 360 | 1.27 mm | 0.75 mm (solder balls 134) | 0.60 mm |

Figure 4:
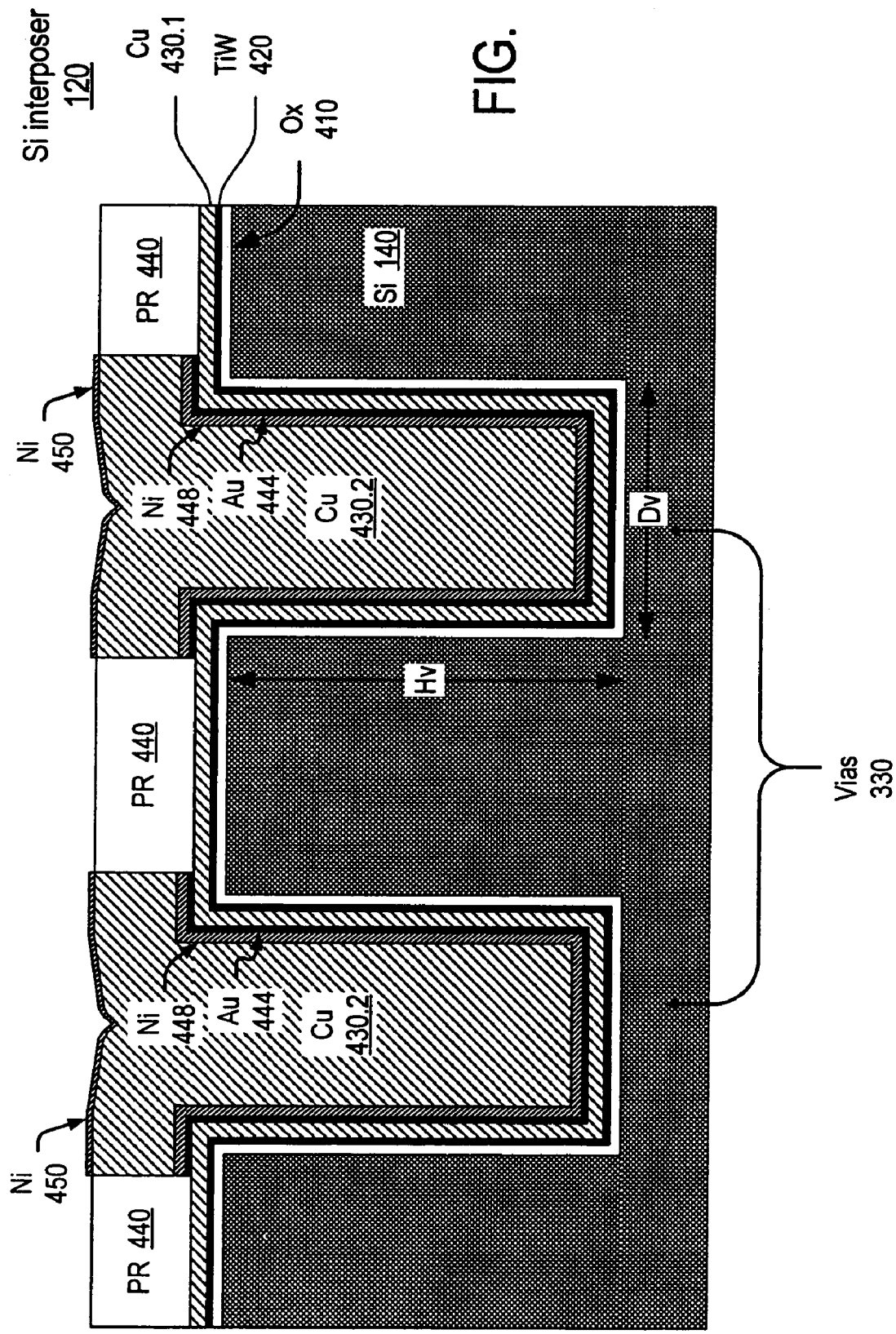

Silicon interposer 120 can be manufactured using conventional techniques. See e.g. the aforementioned U.S. Pat. No. 6,322,903. Other techniques are described in U.S. patent application Ser. No. 10/410,929 filed on Apr. 9, 2003 by P. Halahan et al., entitled "Electroplating and electroless plating of conductive materials into openings, and structures obtained thereby", incorporated herein by reference. Still other techniques can possibly be used, whether known or to be invented. An exemplary manufacturing process is as follows. Vias 330 (FIG. 4) are etched in the top surface of silicon substrate 140 (e.g. monocrystalline silicon) by DRIE (deep reactive ion etching) to an exemplary depth Hv=150 µm. (The dimensions, etching processes, and other particulars are exemplary and not limiting.) The via diameter Dv is 25 µm to 100 µm. The via diameter DV is one of the parameters defining the diameter of contact pads 340 (FIG. 3), and DV is chosen large enough to provide the necessary mechanical strength for the protruding contact pads. Exemplary dimensions below will be given for Dv=65 µm. Silicon dioxide layer 410 is thermally grown on the wafer to a thickness of about 1 µm. A larger thickness can also be used to reduce the capacitance between substrate 140 and the metal features that will be fabricated in vias 330. Barrier layer 420 of titanium-tungsten (TiW) is sputtered on oxide 410 to a thickness of 0.2 µm. A seed copper (Cu) layer 430.1 is sputtered on the wafer to a thickness sufficient to ensure a continuous copper coverage in the vias. Thicknesses of 0.5 µm to 2 µm are believed to be adequate, depending on the sputter technology. A dry photoresist film 440 is deposited on the wafer and patterned to expose the vias 330.

Optionally, gold (Au) layer 444 and nickel (Ni) layer 448 are electroplated, in that order, to an exemplary thickness of 0.2 µm and 1.0 µm respectively.

Copper 430.2 is electroplated on nickel 448 to fill the vias 330 and possibly protrude out of the vias. In the electroplating of layers 444, 448, 430.2, the cathode terminal (not shown) of the power source is placed at the periphery of wafer 140 in physical contact with seed layer 430.1.

Optionally, nickel (Ni) layer 450 is electroplated on the top surface of copper layer 430.2 to an exemplary thickness of 0.5 µm.

Figure 5:
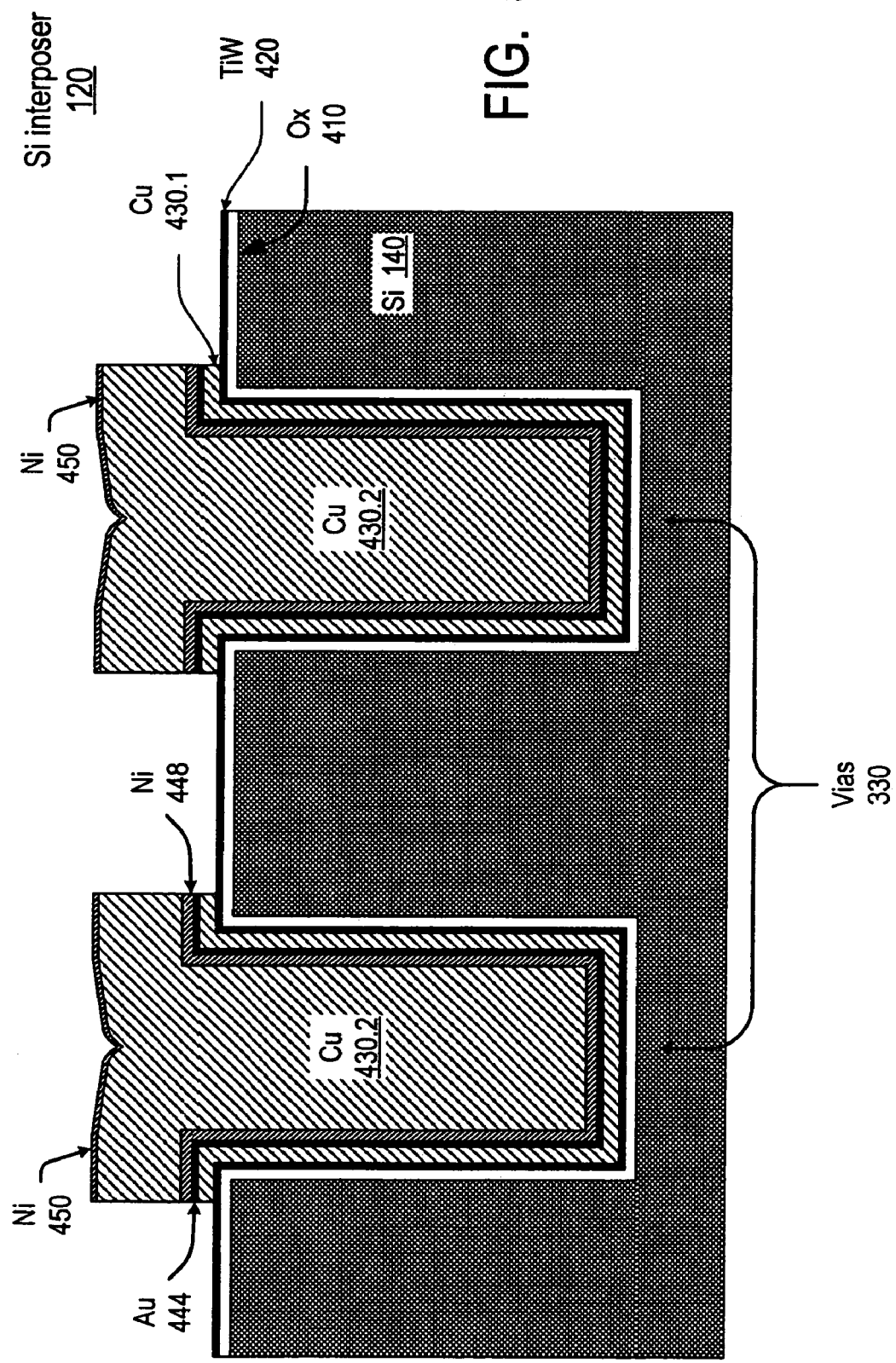

Resist 440 is removed (FIG. 5). A wet copper etch removes the exposed portions of seed copper 430.1, with nickel 450 acting as a mask. Nickel 450 protects copper 430.2 in vias 330. Copper 430.2, 430.1 can be etched laterally during the wet etch, but the lateral etch does not remove the copper over the vias 330 because the copper extends laterally beyond the via edges. In those embodiments in which the nickel 450 is omitted, the copper etch may reduce the thickness of copper 430.2, but this is acceptable if the copper protrusions above the vias are sufficiently thick. In either case, it is desirable for the top surface of copper 430.2 to be at or above the top surface of oxide 410 after the copper etch.

Figure 6:
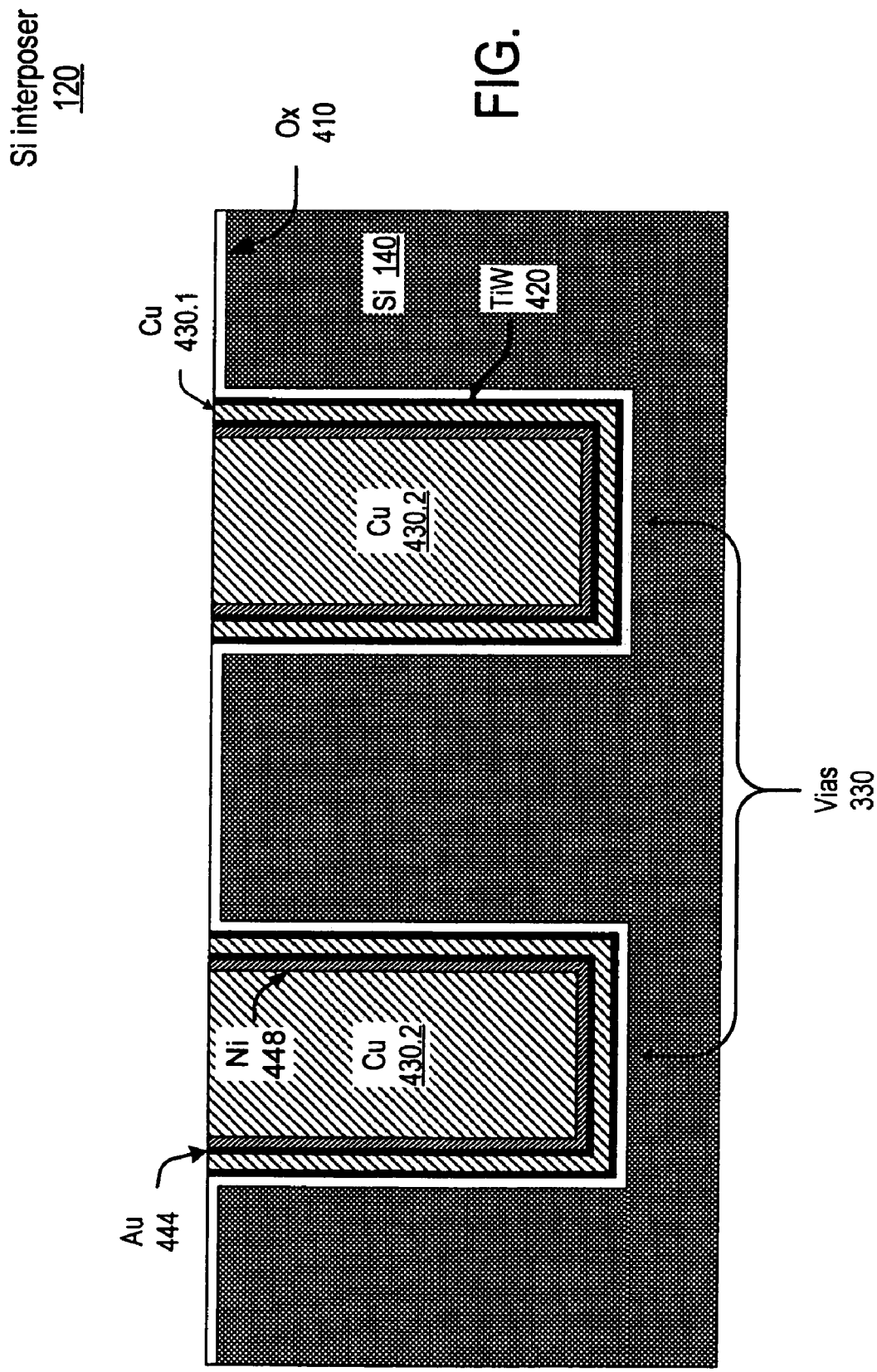

Then a CMP step (chemical mechanical polishing) is performed to remove copper 430.2, nickel 448, gold 444, and TiW 420 off the top surface of substrate 140 (FIG. 6). The CMP stops on oxide 410. The structure has a planar top surface.

In an alternative embodiment, the wet etch of copper 430.1 is omitted, and copper 430.1 is removed by the CMP step. The separate wet etch of copper 430.1 may be desirable however because it may shorten the more expensive CMP step, thus reducing the total manufacturing cost.

Figure 7:
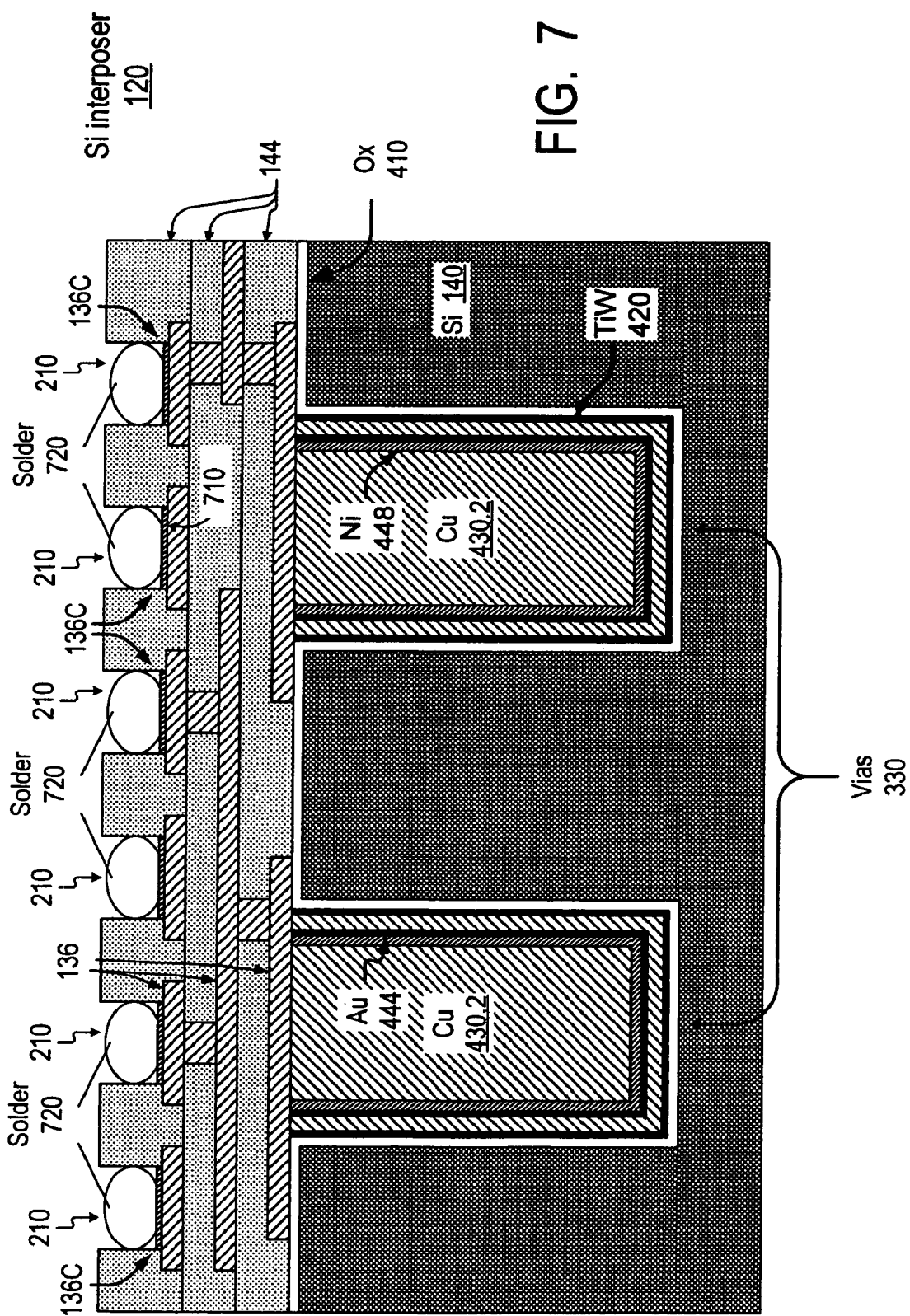

Oxide 410 can be patterned if desired. Metal layers 136 (FIG. 7) and dielectric layers 144 are deposited on the interposer wafer and patterned to provide interconnects and, possibly, other elements as described above. In some embodiments, metal 136 is copper and dielectric 144 is polyimide, but other materials can also be used. Some or all of dielectric layers 144 can be silicon dioxide, photosensitive benzocyclobutene (BCB), polybenzoxazole (PBO), or other materials. For a capacitor, a high dielectric constant material (such as $Ta_2O_5$) can be used. Aluminum, conductive polysilicon, and other materials can be used as layers 136. Cavities 210 are formed in the top dielectric layer 144 to expose the contact pads 136C provided by the top metal layer 136. Solder wettable materials 710 (e.g. Ni and/or Au) can be plated on contact pads 136C if desired.

Solder balls 720 are formed on contact pads 136C, by any suitable technique. For example, solder paste can be deposited to cover the interposer wafer 120, and then wiped off by a squeegee blade to force the solder into cavities 210 and remove it from the top surface of the top layer 144. In some embodiments, interconnects 136 are made of copper, and contact pads 136C are plated with a layer 710 of nickel or gold. Layer 710 does not dissolve in solder 720 and provides a barrier for the copper diffusion from interconnects 136, so the melting temperature of solder 720 does not change when the solder is reflowed.

Figure 1:
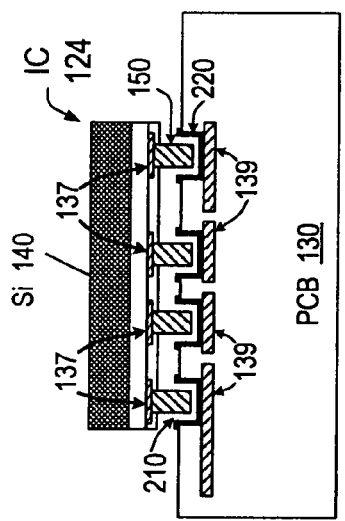
FIG. 1 shows a vertical cross section of an integrated circuit attached to a PCB according to prior art.

In some embodiments, the solder is not placed at this stage to avoid solder melting at high temperatures present in plasma wafer thinning processes described below in connection with FIG. 8. Whether or not the solder is placed at this stage or after the wafer thinning, the top dielectric layer 144 is sufficiently thick to accommodate the solder volume needed for a reliable bond to dies 124 (FIG. 1). In some embodiments, the top dielectric 144 is 50 µm thick. Cavities 210 are about 50 µm deep and have a diameter of about 75 µm.

Then the interposer wafer is thinned from the bottom to expose the gold 444. See FIG. 8. The exposed metal provides the contact pads 340 (FIG. 3) that will be soldered to BT substrate 110. The wafer thinning can be performed with any of the techniques described in the aforementioned U.S. Pat. No. 6,322,903 and U.S. patent application Ser. No. 10/410,929. See also U.S. Pat. No. 6,498,381 issued on Dec. 24, 2002 to Halahan et al. and incorporated herein by reference. In one embodiment, the wafer thinning includes a $CF_4$ plasma etch at atmospheric pressure. The wafer is held from the top by a vortex wafer holder (not shown) that does not touch the wafer except possibly at the wafer periphery. The holder emits gas vortices that create vacuum between the holder and the wafer but do not allow the wafer to touch the top surface of the holder. The plasma etch exposes the oxide 410 and then etches the silicon 140, oxide 410 and TiW 420 selectively to copper 430.1. (Copper 430.1 is etched later as explained below.) The plasma etch etches silicon 140 faster than oxide 410, so the oxide protrudes out of the silicon on the bottom surface of the wafer after the etch. In one embodiment, the final thickness "Tsif" (marked in FIG. 8) of silicon substrate 140 is 100 μm, and it can be smaller (e.g. 35 μm). Oxide 410 and TiW 420 form 5 μm protrusions around the copper 430.1 below the silicon surface. If the solder 720 melting temperature is low, the solder can melt in this process and be blown away by the wafer holder's gas vortices. Therefore, in some embodiments the solder 720 is placed on the wafer after the wafer thinning and, possibly, after the wafer attachment to BT substrate 110.

The plasma etch forms copper oxide (not shown) on the exposed portions of copper 430.1. The copper oxide and the copper 430.1 are etched by a wet etch to expose gold 444. The gold provides a solderable oxide-free surface. Nickel 448 will prevent copper diffusion from layer 430.2 into the solder. The copper diffusion may be undesirable because it increases the solder melting temperature. In other embodiments, the copper diffusion is desirable to achieve a certain solder hierarchy (the hierarchy of the melting temperatures of different solders) as explained below. In such embodiments, the etch of copper 430.1 can be omitted. Nickel 448 can also be omitted.

As stated above, gold 444 can be omitted. The etch of copper 430.1 will then expose nickel 448.

In some embodiments, the copper 430.1 is not etched away. The copper oxide (not shown) on copper 430.1 can be removed by a wet etch. The copper oxide can also be removed by a solder flux during soldering of the interposer wafer to BT substrate 110 (the soldering operation is described below). Layers 444, 448 can be omitted.

Metal contact pads 340 are metal protrusions formed by the metal layers 430.2, 448, 444, 430.1, 420 below the bottom surface of silicon 140. In some embodiments, the height Hd of metal contact pads 340 is 50 μm.

A dielectric layer (not shown) can optionally be formed on the bottom surface of the interposer to cover the silicon 140 but not the metal contact pads 340. The dielectric can be formed without photolithography. See the aforementioned U.S. Pat. Nos. 6,322,903 and 6,498,381 and U.S. patent application Ser. No. 10/410,929.

The interposer wafer can be diced if desired. The dicing can be performed at the same time as the interposer wafer thinning if vias were formed along the dicing lines (scribe lines) simultaneously with vias 330 at the stage of FIG. 4. See U.S. Pat. No. 6,498,074 issued Dec. 24, 2002 to Siniaguine et al., entitled "THINNING AND DICING OF SEMICONDUCTOR WAFERS . . . ", incorporated herein by reference.

In some embodiments, the interposer wafer is not diced. ICs 124 will be attached to the undiced interposer wafer.

In some embodiments, metal 430.2 does not fill the through-silicon vias. Metal 430.2 is a thin film deposited over the via sidewalls, and it can be part of a layer 136. See the aforementioned U.S. Pat. No. 6,498,381. Also, in some embodiments the contact pads 340 do not protrude out of the bottom surface of the interposer.

BT substrate 110 (FIGS. 9 and 10) is formed from one or more BT layers laminated in a conventional manner. Three layers 110.1, 110.2, 110.3 are shown, but any number of layers can be present. Thin film metal layers 910 (e.g. copper) are formed on top of BT layers 110.$i$ (i=1, 2, 3) and on the bottom side of layer 110.1 in a conventional manner to provide signal routing paths and ground and power planes. Layers 910 are interconnected through vias in the BT layers 110.$i$ (i.e. 110.1, 110.2, 110.3) using known techniques to provide conductive paths between contact pads 350 and contact pads 360. The bottom metal layer 910 provides contact pads 360 (FIG. 3) at the bottom surface of BT substrate 110.

Top contact pads 350, and the top metal layer 910, are formed below the top BT layer 110.3. In FIG. 9, the top contact pads 350 and the top metal 910 are formed on BT layer 110.2. Layer 110.3 has vias 210B exposing the contact pads 350. Vias 210B form cavities in the top surface of BT substrate 110. Silicon interposer contact pads 340 will be inserted into these cavities to form a reliable mechanical and electrical contact.

In one embodiment, each BT substrate cavity 210B has a diameter Dcav=150 μm to accommodate a 50 μm to 60 μm diameter Dc of the contact pads 340. Dc can be calculated starting with the diameter Dv (FIG. 4) of via 330, by subtracting double the thickness of the layers 410, 420, 430.1, 444, 448. The depth Hcav of each cavity 210B (about equal to the thickness of layer 110.3) is 50 μm for a 50 μm height Hd of contact pads 340 (Hcav is measured to the top surface of contact pads 350).

Cavities 210B are filled with solder paste 930. In one embodiment, the solder paste is deposited to cover the BT substrate, and then is wiped off by a squeegee blade to force the solder into cavities 210B and remove it from the top surface of BT layer 110.3. The solder is chosen to have a high melting temperature to provide a desired solder hierarchy for subsequent solder attachment of dies 124 and PCB 130. In some embodiments, the solder paste is a no-clean type NC253 available from AIM of Montreal, Canada. This paste incorporates solder flux but there is no need to clean the flux after the solder reflow.

No-flow underfill 940 (dielectric) is dispensed on BT substrate 110 at the future site of interposer 120. In some embodiments, the underfill is type STAYCHIP™ 2078E available from Cookson Electronics, a company having an office in Georgia, the United States of America. This underfill performs both the underfill function and the solder flux function. The underfill can be dispensed with a dispensing system of type CAMELOT/SPEEDLINE 1818 available from Cookson Electronics.

Figure 10:
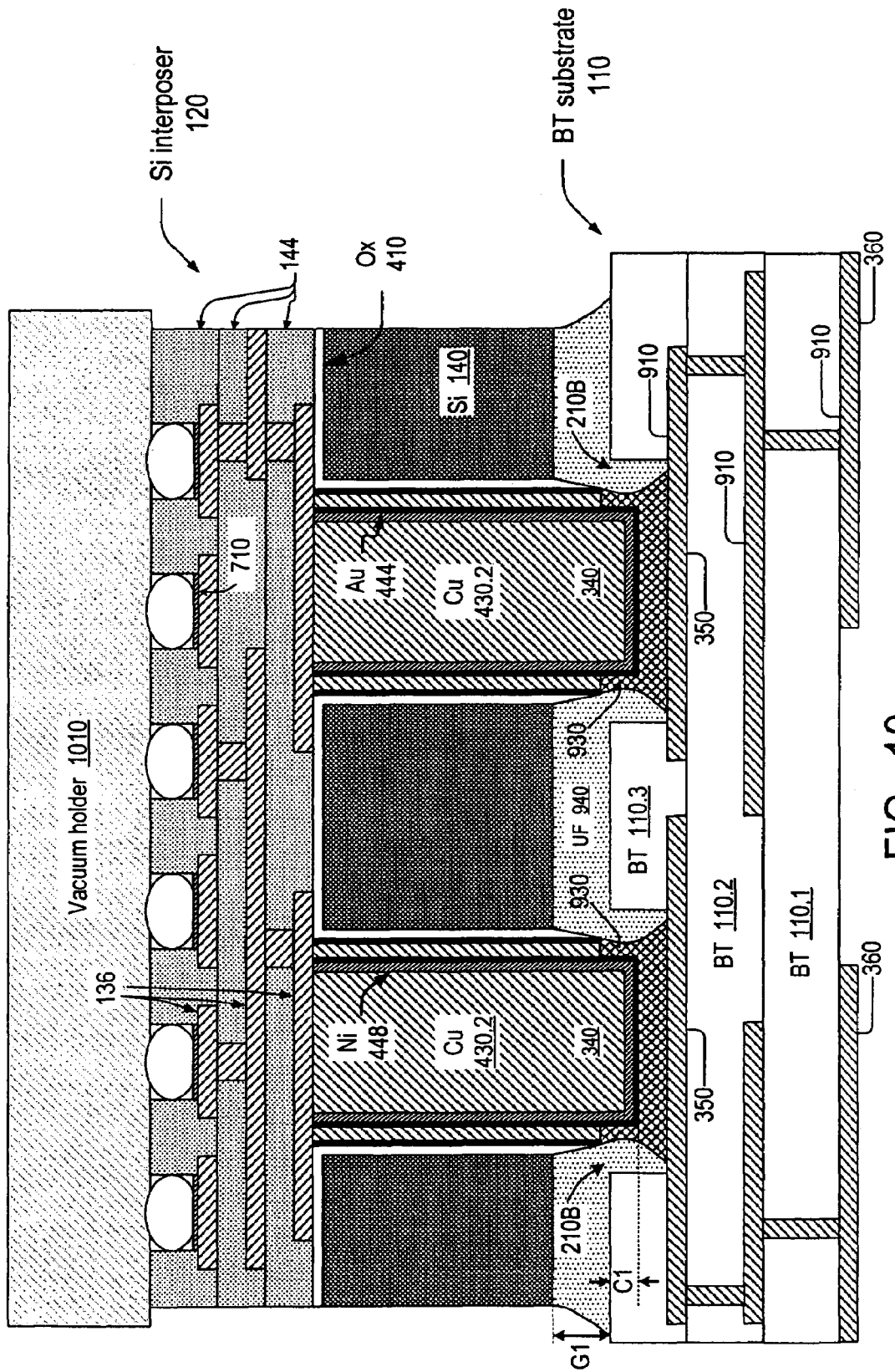
FIGS. 10–13 show vertical cross sections of integrated circuits attached to substrates according to embodiments of the present invention.

Interposer wafer 120 is placed on BT substrate 110 (FIG. 10). Protruding contact pads 340 enter the BT substrate cavities 210B and contact the solder 930 but do not necessarily reach the metal 910 of contact pads 350. A uniform height of contact pads 340 is not required for a good electrical contact.

Underfill 940 spreads out under the interposer. In the embodiment shown, the bottom surface of silicon 140 does not reach the BT substrate. Underfill 940 helps insulate the silicon from solder 930. Therefore, it is unnecessary to form a dielectric layer on the bottom silicon surface.

The interposer placement can be performed with a placement tool of type SIPLACE F4 available from Siemens corporation of Germany. The placement tool picks up the interposer from the top by a vacuum holder 1010 schematically shown in FIG. 10. The vacuum pick-up flattens the interposer if the interposer is warped. Dielectric 144 protects the interposer from being damaged by the holder. Other placement tools, with vacuum and non-vacuum holders, known or to be invented, can also possibly be used.

The structure is heated to reflow the solder paste 930 and cure the underfill 940. The solder wets the bottom and side surfaces of copper contact pads 340. In one embodiment, the final value of the gap G1 between the silicon 140 and the BT substrate 110 is 25 μm. The gap values of 5 to 10 μm and larger are believed to be appropriate to provide sufficient electrical insulation if no dielectric is formed on the bottom surface of silicon 140. The contact 340 portion inside the vias 210B is 25 μm high (C1=25 μm in FIG. 10). The value C1 is in the range from 10 μm to 45 μm in some embodiments.

If the solder 720 was placed on the interposer before the interposer attachment to BT substrate 110, solder 720 may or may not be reflowed during this step depending on the solder 720 melting temperature.

Then vacuum holder 1010 releases the interposer.

In some embodiments, the vacuum holder releases the interposer before the reflow of solder paste 930. The interposer stays in place due to a surface tension between silicon 140 and the underfill 940. Multiple interposers can be placed on BT substrate 110, and the solder reflow and underfill curing can be performed in a single heating step for all the interposers, after the vacuum holder 1010 is removed. A similar technique has previously been applied for flip-chip mounting of dies on a BT substrate, as described in M. Painaik and J. Hurtley, "Process Recommendations for Assembly of Flip Chips using No-flow Underfill", Technical Bulletin, Cookson Semiconductor.

Figure 11:
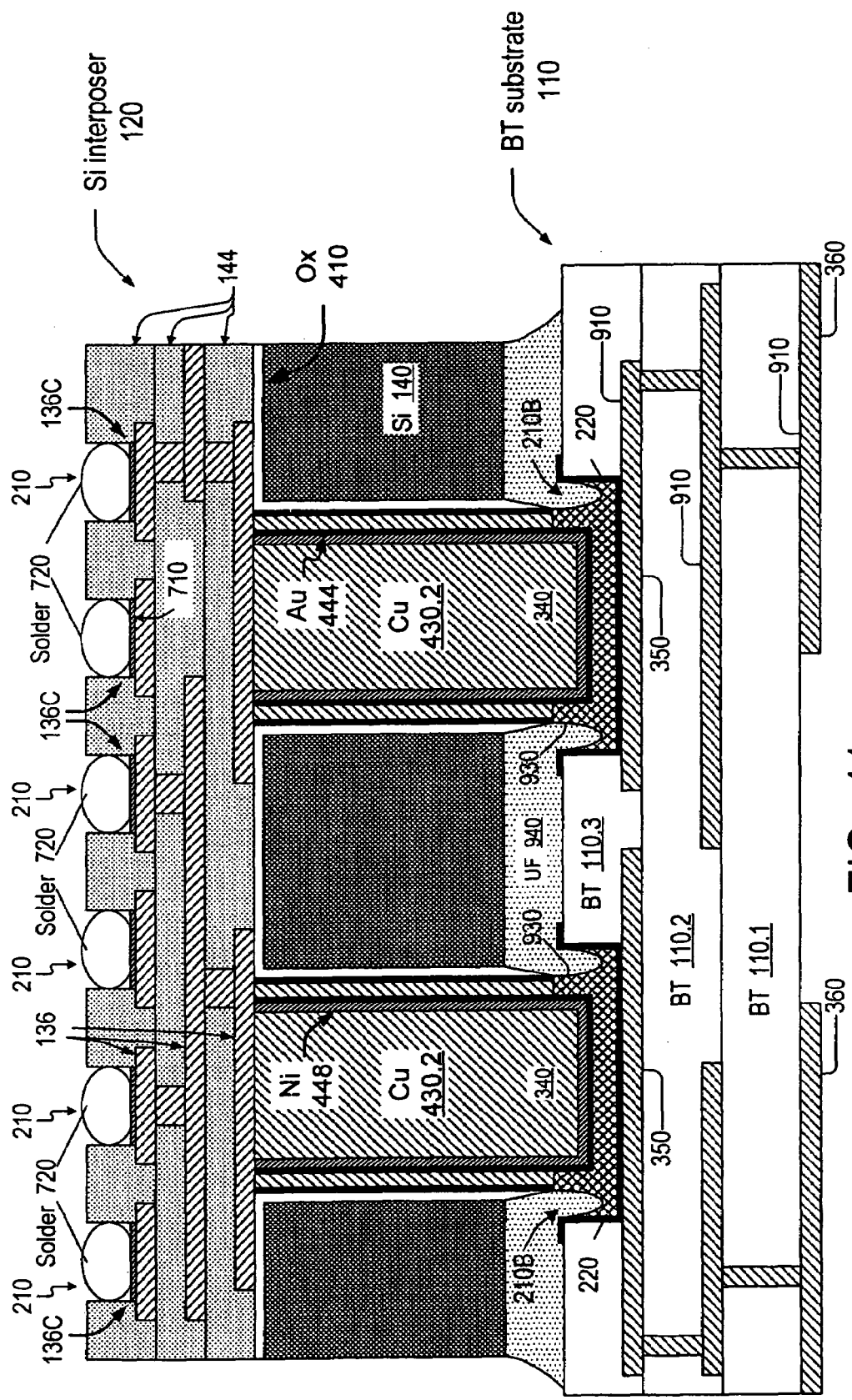

FIG. 11 illustrates another embodiment. The BT substrate 110 is similar to the BT substrate of FIGS. 9 and 10, but a metal layer 220 is formed on the bottom and sidewalls of each BT substrate cavity 210B. Metal 220 is believed to improve the strength and the electrical conductivity of the solder bond between contact pads 340 and contact pads 350. Metal layer 220 can be copper deposited on the BT substrate and patterned by lift-off or some other process. In FIG. 11, metal 220 extends out of BT substrate cavities 210B to the top surface of the BT layer 110.3 but does not provide any interconnects or other elements on the top surface of layer 110.3. Metal 220 is present only in the immediate vicinity of each BT substrate cavity 210B. Each contact pad 350 includes the portions of metal layers 910, 220 on the bottom and sidewalls of the corresponding BT substrate cavity 210B. In other embodiments, metal 220 provides an additional level of interconnects and/or a power or ground plane on layer 110.3.

In the BT embodiment described above, the BT layers 110.1, 110.2, 110.3 are laminated on top of each other. Each layer 110.1, 110.2 is a solid sheet placed on the structure in a solid form. In some embodiments, the top layer 110.3 is made from a material different from the material of layers 110.1, 110.2. For example, solder dam materials can be used, such as photoimageable polyimide, Dupont VACREL 8100, Dupont Flexible PhotoImageable Coverlay (PIC) 1000 & 2000, Shipley (Dynachem) DynaMASK 5000, Shipley ConforMASK 2500, and possibly others. Some of the solder dam materials (e.g. polyimide) can be deposited in a liquid (possibly viscous) form and then cured.

In some embodiments, solder 720 has a lower melting temperature than solder 930. Therefore, solder 930 is not melted during the attachment of dies 124.

Figure 12:
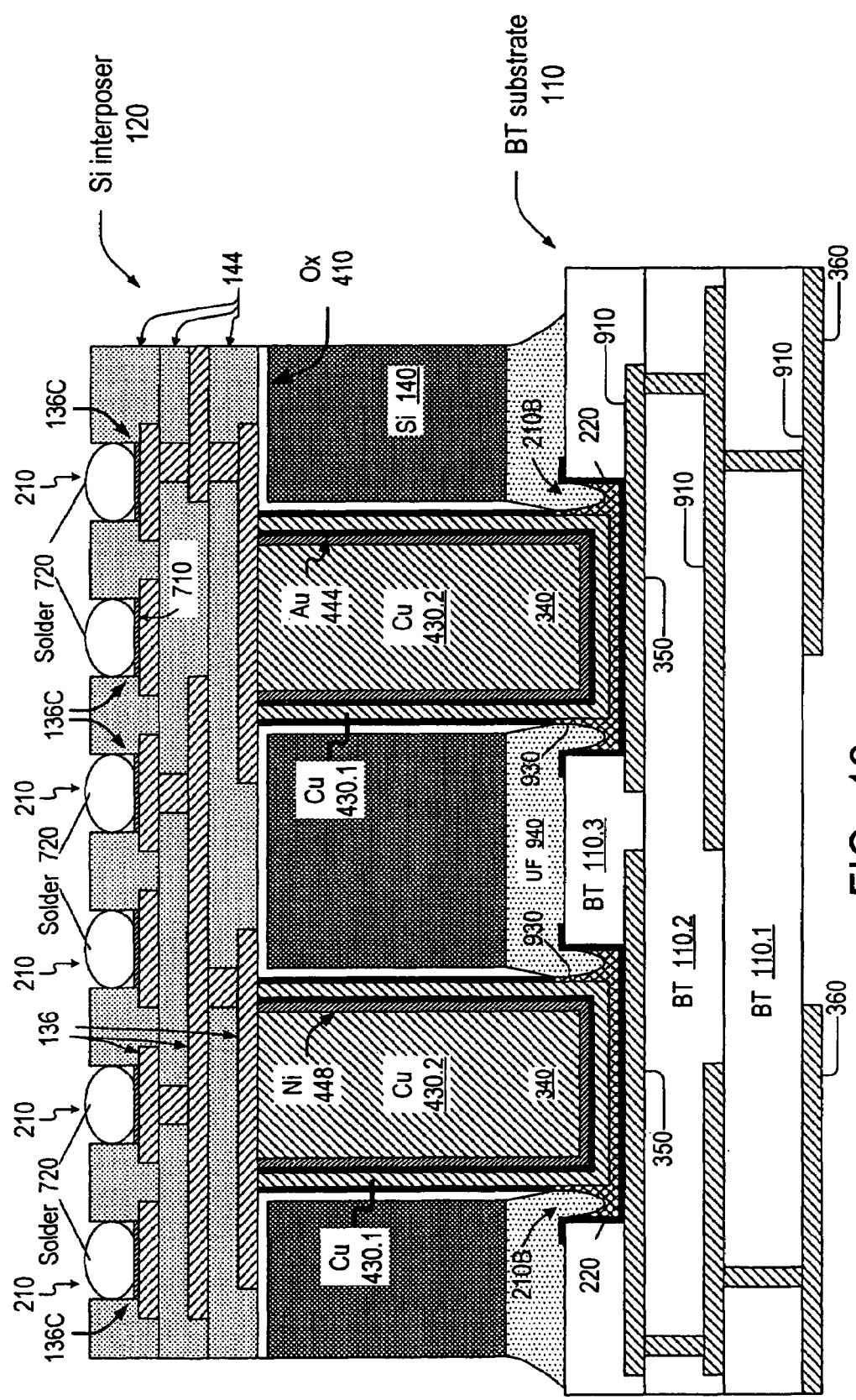

In other embodiments, solder 720 initially has the same or higher melting temperature than solder 930, but the melting temperature of solder 930 is increased during the attachment of interposer 120 to BT substrate 110. The melting temperature of solder 930 becomes higher than the melting temperature of solder 720. The melting temperature of solder 930 is increased because the copper from layer 220 and/or layer 350 dissolves in solder 930. In the embodiment of FIG. 12, copper 430.1 was not etched away as in FIG. 8, so copper 430.1 can also dissolve in solder 930. In some embodiments, solders 720, 930 are initially the same solder (i.e. the same material), which simplifies the wafer fabrication. For example, a eutectic solder Sn/Ag3.0/Cu0.5 (known as type LF128 from AIM) can be used.

Metal contact pads 136C can be formed from a material other than copper. This may be desirable if solder 720 is placed on the interposer before the interposer attachment to BT substrate 110, because copper in pads 136C could diffuse in solder 720 during the interposer attachment to the BT substrate and increase the solder 720 melting temperature. In some embodiments, interconnects 136 are made of copper, but contact pads 136C are plated with a layer 710 of nickel or gold. Layer 710 does not dissolve in solder 720 and provides a barrier for the copper diffusion from interconnects 136, so the melting temperature of solder 720 does not change. In other embodiments, the melting temperature of solder 720 changes during the attachment of the interposer to substrate 110, but the melting temperature of solder 720 remains below the melting temperature of solder 930.

Figure 13:
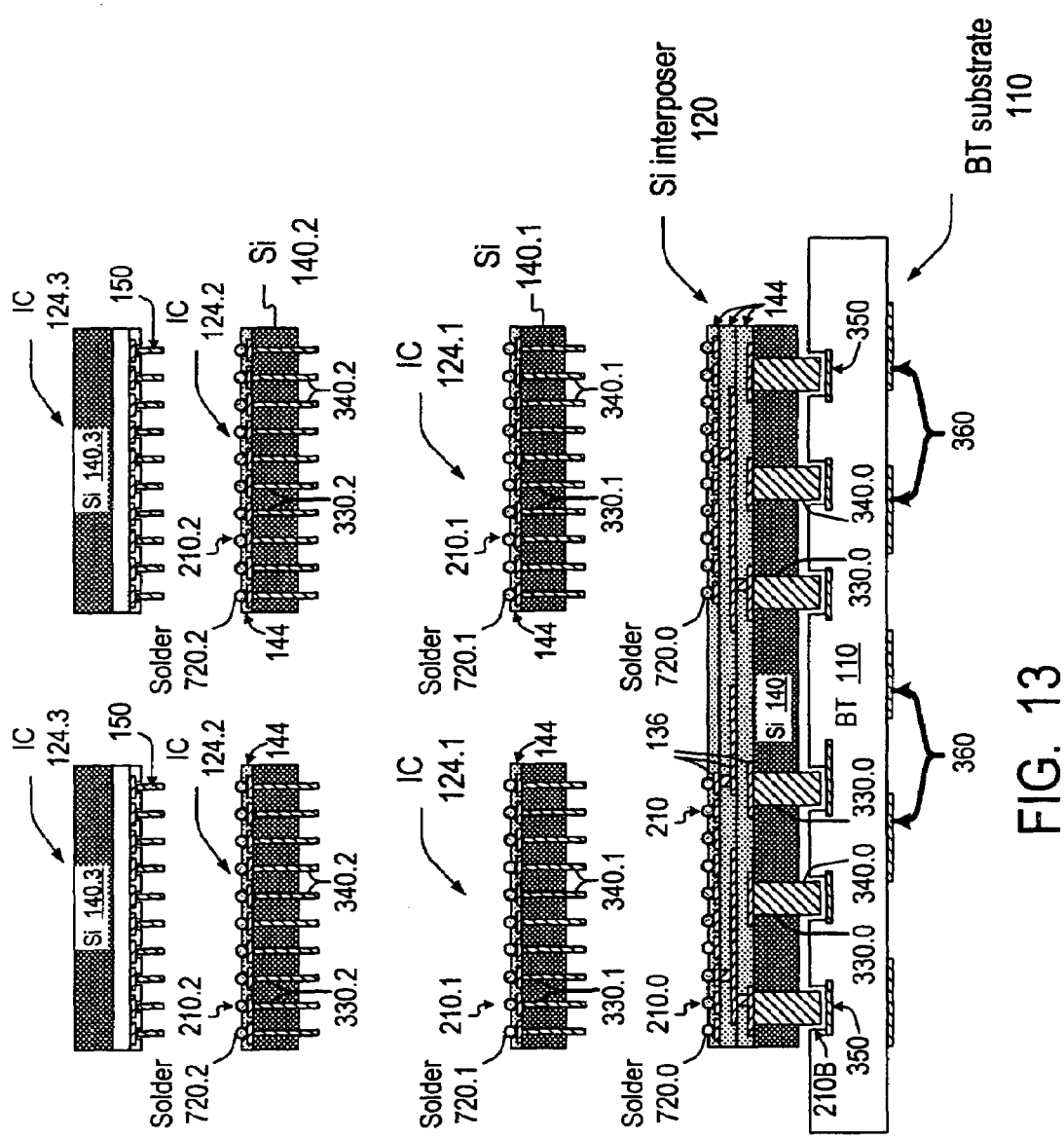

FIGS. 13–14 illustrate a possible manufacturing sequence with multiple die levels 124.1, 124.2, 124.3 attached to the packaging substrate. The packaging substrate is manufactured as in FIG. 10, 11 or 12. The interposer vias are marked 330.0 (instead of 330 as in FIG. 3), the contact pads at the bottom of the interposer are marked 340.0, and the solder at the top is marked 720.0. The cavities at the top of the interposer are marked 210.0.

Each die 124.1 has one or more metalized through vias 330.1 formed in the die's semiconductor substrate 140.1 (e.g. monocrystalline silicon). Each via 330.1 passes between the top and bottom surfaces of substrate 140.1. Conductive paths are provided from contact pads at the top of each die 124.1 to contact pads 340.1 at the bottom of the die through the vias 330.1. Contact pads 340.1 protrude out of the respective vias 330.1. The dies 124.1 can be manufactured using the same techniques as described above for interposer 120 (involving the wafer thinning to expose the contact pads 340.1). Each die may have the same general structure as interposer 120 in FIGS. 10–12. Of course, the circuitry in dies 124.1 does not have to be identical to the interposer circuitry, and different dies 124.1 may differ from each other. Also, contact pads 340.1 may have smaller dimensions, and may be placed closer to each other, as they do not have to meet the BT substrate dimension requirements. Pads 340.1 can be copper/nickel/gold structures as in FIG. 12, or they can be made from other materials. The metal in vias 330.1 is insulated from substrate 140.1 by a dielectric 410 (FIG. 12).

In some embodiments, dies 124.1 and interposer 120 have devices (e.g. transistors, diodes, and others) manufactured at the top surface (active surface). Transistor source/drain regions, diodes' cathodes and anodes, and other elements can be formed in semiconductor substrates 140.0, 140.1 of interposer 120 and dies 124.1 at the top surface of the respective substrates. Cavities 210.1 are formed in the top surface of dies 124.1, and solder balls 720.1 are formed in the cavities on the dies' top contact pads, possibly before the wafer thinning operation exposing the contact pads 340.1, as in FIGS. 10–12.

Dies 124.2 may be similar to dies 124.1. Dies 124.2 include metalized vias 330.2 in semiconductor substrates 140.2, and contact pads 340.2 protruding out of the vias on the bottom. Dies 124.2 may contain devices (e.g. transistors, diodes, and others) manufactured at the top surface (active surface) of semiconductor substrates 140.2. Transistor source/drain regions and other elements can be formed in semiconductor substrates 140.2 at the top surface. Cavities 210.2 are formed in the top surface of dies 124.2, and solder balls 720.2 are formed in the cavities on the dies' top contact pads, possibly before the wafer thinning operation exposing the contact pads 340.2, as in FIGS. 10–12.

The third level dies 124.3 are like dies 124 in FIGS. 2 and 3. The semiconductor substrates of dies 124.3 are marked 140.3. The dies' active surface is the bottom surface.

The manufacturing sequence is shown in FIG. 14. Interposer 120 is attached to BT substrate 110 as described above with respect to FIGS. 10–12 (step 1420). During this step, the melting temperature of solder 930 (FIGS. 10–12) increases and becomes higher than the melting temperature of solders 720.0, 720.1, 720.2. Solder 720.0 can be placed on the interposer after the attachment to BT substrate 110. If solder 720.0 is placed before the attachment, solder 720.0 may or may not be melted during the attachment step, but its melting temperature does not change because this solder is not in contact with copper (there is no copper on the top surface of the top contact pads of the interposer). The melting of solder 720.0 does not present a problem because the dies 124.1 have not yet been attached to the interposer. If solder 720.0 is placed on the interposer after the attachment to the BT substrate, solder 720.0 can be reflowed in a separate step before the attachment of dies 124.1. The solder reflow does not increase the melting temperature of solder 720.0.

In some embodiments, all of solders 720.0, 720.1, 720.2, 930 are initially the same material. In an illustrative example, the solders are eutectic type LF128 described above, with the initial melting temperature of 218° C. The melting temperature of solder 930 increases to about 230° C. in step 1420.

At step 1430, dies 124.1 are soldered to interposer 120 with solder 720.0, at a temperature of about 218° C. or higher, but below 230° C. not to melt the solder 930. Contact pads 340.1 are inserted into cavities 210.0 of interposer 120. The copper from contact pads 340.1 dissolves in solder 720.0 and increases its melting temperature to about 230° C. Solder 720.1 may be placed on dies 124.1 in advance and may melt, but its melting temperature does not increase because the solder 720.1 is not in contact with copper or other material that could increase the solder melting temperature (the top surface portions of the top contact pads of die 124.1 are made of suitable materials to ensure that the solder melting temperature does not increase).

At step 1440, dies 124.2 are attached to dies 124.1 with solder 720.1, at a temperature below 230° C. Contact pads 340.2 are inserted into cavities 210.1 of dies 124.1. Solders 720.0 and 930 do not melt. The melting temperature of solder 720.1 is increased to about 230° C. due to the diffusion of copper from contact pads 340.2.

At step 1450, dies 124.3 are flip-chip attached to dies 124.2 with solder 720.2, at a temperature below 230° C. Bumps 150 are inserted into cavities 210.2 of dies 124.2. Solders 930, 720.0, 720.1 do not melt. If desired, bumps 150 may include copper to increase the melting temperature of solder 720.2. The higher melting temperature may be desirable to prevent the solder melting during the attachment of BT substrate 110 to PCB 130 (FIG. 3). For example, the solder 134 used for the PCB attachment may be the same material (LF128) as the solders 930, 720.0, 720.1, 720.2.

Many variations are possible. For example, any number of dies can be used at each level. Also, one or more dies 124.2 can be attached directly to interposer 120, i.e. there may be three levels of dies over one interposer area but only two levels of dies over another interposer area. Any number of die levels can be present in different interposer areas. Dies 124.3 may be omitted. Dies 124.2 may have no contact pads on the top, or they may have contact pads on the top which can be wire bonded to other substrates.

Other solder types and melting temperatures can be used, and materials other than copper can be used to increase the melting temperatures. Different materials and contact pad structures can be used in different dies. Different semiconductor substrates can be different semiconductor materials in the same structure.

Varying the solder melting temperature to achieve a desired solder hierarchy is not limited to the interposer structures, but may be used in other semiconductor packages, known or to be invented, with or without interposers.

FIG. 15 shows another manufacturing sequence. See also the aforementioned U.S. Pat. No. 6,322,903. Below, numerals 124.2, 124.1, 120 denote both the dies as shown in FIG. 13 and the wafers from which the dies are obtained. Dies 124.3 are attached to wafer 124.2 (step 1510) before the wafer 124.2 is thinned and diced. Contacts 340.2 are not yet exposed. Then the wafer 124.2 is thinned to expose the contact pads 340.2 (step 1520), and diced (step 1524). Then dies 124.2 are attached to wafer 124.1 (step 1530) before the wafer is thinned and diced. Then wafer 124.1 is thinned to expose contact pads 340.1 (step 1540), and diced (step 1544). Then dies 124.1 are attached to interposer wafer 120 (step 1550) before the interposer wafer is thinned and diced. Then interposer wafer 120 is thinned to expose the contact pads 340.0 (step 1560), and diced (step 1564). Then the interposer is attached to BT substrate 110 (step 1570). All the thinning and dicing operations (steps 1520, 1524, 1540, 1544, 1560), 1564 are performed when the wafer or die being thinned has been attached to other dies. The structure has therefore a greater mechanical strength and greater thermal dissipation capabilities for the thinning operation. Plasma and non-plasma thinning process can be used, and the solder can be protected with suitable underfill or other coatings. All the solders can be initially the same material. The solder attachment increases the melting temperature of each solder being reflowed, so the solder does not melt in the subsequent soldering steps, as in FIG. 14.

The invention is not limited to any particular manufacturing sequence however.

In some embodiments, the same dimensions are obtained for the attachment of dies 124.1, 124.2, 124.3 as for the attachment between the BT substrate and the interposer. More particularly, the final value of the gap between the silicon 140.1 and interposer 120 or between the silicon 140.2 and the dies 124.1 is 25 μm (gap values of 5 to 10 μm and larger are believed to be appropriate to provide sufficient electrical insulation if no dielectric is formed on the bottom surface of silicon 140.1 or 140.2); the portions of contacts 340.1, 340.2, 150 inside the respective cavities 210.0, 210.1, 210.2 are 25 μm high (note dimension C1 in FIG. 10). This value is in the range from 10 μm to 45 μm in some embodiments. The top dielectric layer on interposer 120 and dies 124.1, 124.2 is 50 μm thick. Other dimensions can also be used.

Underfill (not shown) can be injected between the interposer and the dies 124.1, between the dies 124.1 and 124.2, and between the dies 124.2 and 124.3 using known techniques. No flow underfill can also be used.

Figure 16B:
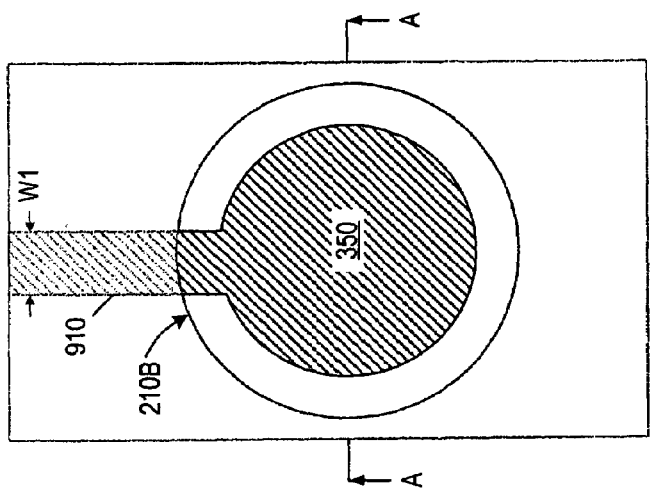
FIG. 16B is a top view of the structure of FIG. 16A.
Figure 16A:
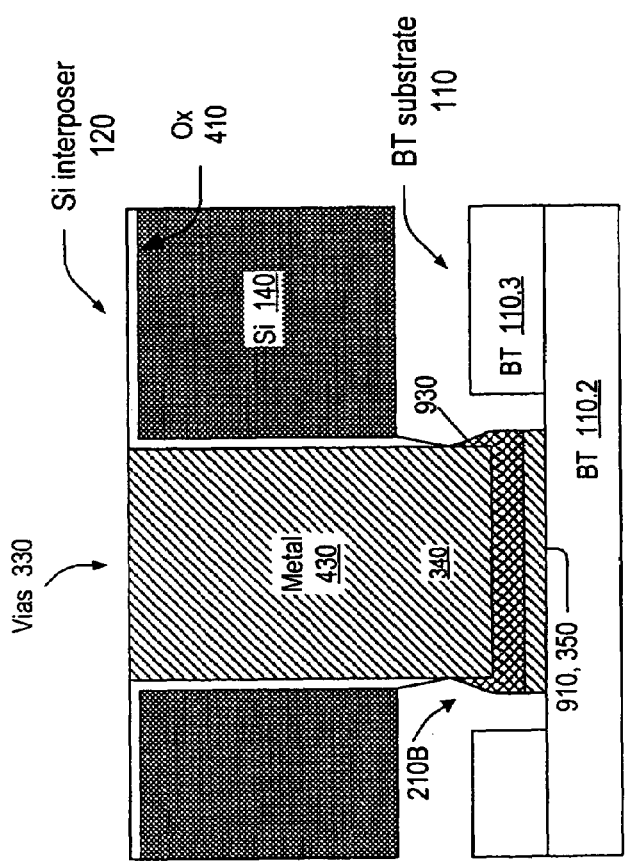
FIG. 16A shows a vertical cross section of an interposer attached to a substrate according to some embodiments of the present invention.

FIGS. 16A, 16B illustrate an embodiment in which a contact pad 350 (made from metal 910) covers only a portion of the bottom surface of opening 210B in BT substrate 110. FIG. 16B is a top view, and FIG. 16A shows a vertical cross section along the line A—A in FIG. 16B. Only portions of interposer 120 and substrate 110 are shown, with only one contact 340 and opening 210B, though many such contacts and openings can be present. The contact 340 at the bottom of interposer 120 is shown to be formed by metal 430 in through silicon via 330, but the contact 340 may have any structure, including the structures of FIGS. 10–13, the structures used for contacts 150 of FIGS. 1–2, and other structures known or to be invented. Substrate 110 can be a non-BT substrate, e.g. it can be a PCB or some other integrated circuit packaging substrate, or an integrated circuit die or an integrated circuit wafer (e.g. such as a die 124.1 or 124.2 in FIG. 13). Substrate 120 can be a semiconductor integrated circuit or a non-semiconductor packaging substrate.

The advantage of the contact pad 350 as in FIGS. 16A, 16B is that the solder 930 does not wet the dielectric 110.2 on the bottom of opening 210B. Therefore, more solder will gather closer to contact 340, and the solder will reach higher up along the contact surface. This is believed to improve the mechanical strength and electrical conductivity of the solder joint. Less solder is needed for good mechanical strength and electrical conductivity, so the diameter of opening 230B can be reduced (this diameter controls the solder volume by controlling the volume of the solder paste in opening 230B).

In FIG. 16B, only one conductive line 910 extends from contact pad 350, but many lines 910 can extend from the contact pad. The width W1 (20–30 µm in some embodiments) of line 910 is shown as smaller than the diameter of pad 350, but this is not necessary. W1 can be any number, with any relationship between W1 and pad 350. Also, the invention is not limited to the circular shapes of pad 350 and opening 210B. Any shapes can be employed.

Figure 17:
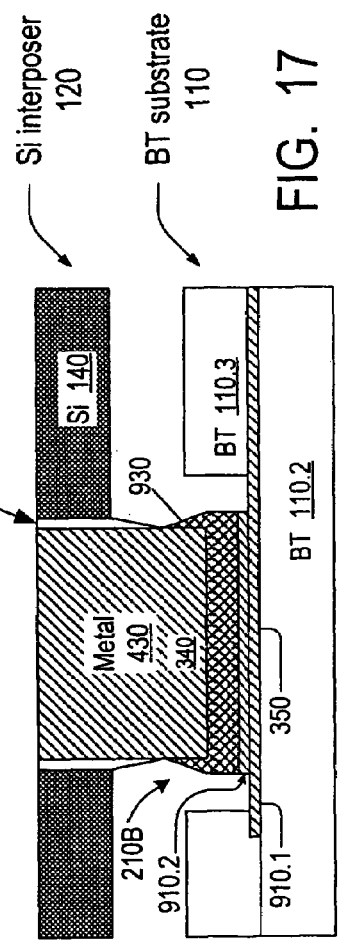
FIG. 17 shows a vertical cross section of an interposer attached to a substrate according to some embodiments of the present invention.

In FIG. 17, contact pad 350 includes two conductive layers 910.1, 910.2. The bottom layer 910.1 covers the whole bottom of opening 230B, and the top layer 910.2 covers only a portion of the bottom of opening 230B. Bottom layer 910.1 is less solder wettable than the top layer 910.2. In still other embodiments, bottom layer 910.1 does not cover the whole bottom of opening 230B, and the top layer 910.2 covers a smaller portion of the bottom of opening 230B than the top layer 910.1.

FIGS. 18, 19 illustrate possible shapes of solder 930 in the embodiments of FIGS. 16A, 16B, 17 after the solder reflow before the attachment of interposer 120 to the BT substrate. The solder shape is an approximation; the solder is assumed to wet only the pad 350, ignoring the line 910 extending from the pad (see FIG. 16B). It is assumed that the solder shape is a sphere truncated at the bottom, of some diameter Ds. Symbol Hs denotes the solder ball height above contact pad 350. Hc is the depth of cavity 210B. Db is the diameter of pad 350. Dc is the diameter of cavity 210B (shown as Dcav in FIG. 9).

Assuming the solder paste filled the cavity before the solder reflow, and ignoring the thickness of pad 350, the solder paste volume Vc was the cavity volume, i.e.:

$$Vc = \pi * Dc^2 * Hc/4 \quad (1)$$

We will assume that the solder paste was half solder and half flux. After the reflow, the solder volume Vs is therefore one half of Vc, i.e.

$$Vs = \pi * Dc^2 * Hc/8 \quad (2)$$

Also, Vs is the volume of the truncated solder sphere, and therefore:

$$Vs = \pi * Ds^3/6 - \pi * (3*Db^2 + 4*h^2) * h/24 \quad (3)$$

where h=Ds−Hs.

From (2) and (3) we obtain:

$$4*Ds^3 - (3*Db^2 + 4*h^2)*h = 3*Dc^2*Hc \quad (4)$$

where $$Ds = (4*h^2 + Db^2)/(4*h) \quad (5)$$

and, as noted above, $$Hs = Ds - h \quad (6)$$

Example: suppose Dc=150 µm, Hc=50 µm, Db=80 µm. From equation (4):
h=20.57 µm
From equation (5):
Ds=98.35 µm
From equation (6):
Hs=77.78 µm Other examples are given in the following Table 2 for Dc=150 µm. The dimensions are in micrometers. Tilda ("~") denotes approximation.

TABLE 2

| Db | Ds | Hs | Solder Profile in FIG. 19 |
|---|---|---|---|
| 65 | ~96 | ~83 | 930A |
| 80 | ~98 | ~78 | 930B |
| 100 | ~105 | ~69 | 930C |
| 150 | ~170 | ~45 | 930D |

The invention is not limited to the embodiments described above. For example, non-eutectic solders can be used. The "melting temperature" is any temperature as high or higher than the solidus and but not higher than the liquidus. As is known, the solidus is the highest temperature at which 100% of the solder is solid, i.e. the solder is just beginning to melt. The liquidus is the lowest temperature at which 100% of the solder is liquid. For a eutectic solder, the solidus and the liquidus are the same.

Also, in some embodiments, the cavities 210B (FIG. 9) extend through two or more BT layers, for example, through layers 110.3 and 110.2. Contact pads 350 can thus be formed from the metal layer 910 located between the BT layers 110.1, 110.2. The layer 910 on BT layer 110.2 can be used for interconnects, power or ground planes, or other elements as discussed above. The invention is not limited to particular materials, dimensions and processes. For example, anisotropic adhesive, conductive epoxy, and/or thermocompression can be used instead of solder. Bumps 150 or contacts 340, 340.0, 340.1, 340.2 may include a solder layer. For example, they may include copper pillars with solder thereon, or they can be solder bumps. The invention is applicable to non-silicon semiconductor integrated circuits. The integrated circuits can be entire wafers or dice obtained by dicing the wafers.

The interposer may include capacitors having a capacitance of 5.0 pF or higher. For example, capacitance values of 10 pF, 100 pF, or higher have been used on circuit boards to decouple the power lines from the ground lines or for other purposes, and such capacitors can be manufactured in the interposer. Resistors having resistance values of 10 Ω and higher (e.g. 50 Ω, 100 Ω, or 150 Ω) are used on circuit boards for line termination and other purposes, and they can be manufactured in the interposer. Inductors having inductance values of 100 nH or higher are commonly used on circuit boards and can be manufactured in the interposer. The invention is not limited to particular capacitance, resistance or inductance values. Other embodiments and variations are within the scope of the invention, as defined by the appended claims.

The invention claimed is:

1. A manufacturing method comprising:
   (1) obtaining a first integrated circuit structure comprising:
   a semiconductor substrate;
   one or more first conductive contact pads protruding out at a surface of the first integrated circuit structure;
   (2) obtaining a first substrate comprising a circuit which comprises one or more first conductive contact pads, wherein at least a portion of each of the one or more first contact pads of the first substrate is located in a corresponding via in a surface of the first substrate, the portion having a first surface facing a sidewall of the via and a second surface opposite to the first surface, the second surface facing an interior of the via and extending upward along the sidewall;
   (3) inserting the protruding first contact pads of the first integrated circuit structure into the corresponding vias of the first substrate and attaching the protruding first contact pads of the first integrated circuit structure to the first contact pads of the first substrate.

2. The method of claim 1 wherein the operation (3) is performed without melting the protruding first contact pads of the first integrated circuit structure.

3. The method of claim 2 wherein in the operation (3) the first contact pads of the first integrated circuit structure are soldered to the first contact pads of the first substrate.

4. The method of claim 1 wherein an outer protruding surface of the first contact pads of the first integrated circuit structure is made of copper and/or gold and/or nickel.

5. The method of claim 1 wherein the first substrate comprises a semiconductor substrate.

6. The method of claim 1 wherein the first substrate is an integrated circuit packaging substrate which does not comprise a semiconductor substrate.

7. The method of claim 1 wherein the first substrate is a printed circuit board.

8. The method of claim 1 wherein in the operation (3) the attachment is performed without solder with thermal or thermosonic compression.

9. The method of claim 1 wherein after the operation (3) a spacing between the bottom surface of the semiconductor substrate and the top surface of the first substrate is at least 5 µm.

10. The method of claim 1 wherein at least a portion of the bottom surface of the semiconductor substrate is not covered by any dielectric layer in the first integrated circuit structure.

11. The method of claim 1 wherein at least a portion of the bottom surface of the semiconductor substrate is covered by a dielectric in the first integrated circuit structure.

12. A manufacturing method comprising:
   (1) obtaining a first integrated circuit structure comprising:
   a semiconductor substrate;
   one or more first conductive contact pads protruding out at a surface of the first integrated circuit structure;
   (2) obtaining a first substrate comprising a circuit which comprises one or more first conductive contact pads, wherein at least a portion of each of the one or more first contact pads of the first substrate is located in a corresponding via in a surface of the first substrate;
   (3) inserting the protruding first contact pads of the first integrated circuit structure into the corresponding vias of the first substrate and attaching the protruding first contact pads of the first integrated circuit structure to the first contact pads of the first substrate;
   wherein in the operation (3) at least 10 µm of each protruding first contact pad is inside the corresponding via.

13. The method of claim 1 wherein the first integrated circuit structure is an interposer that comprises no semiconductor circuit elements in the semiconductor substrate.

14. The method of claim 1 wherein the first integrated circuit structure comprises a semiconductor circuit element in the semiconductor substrate.

15. A manufacturing method comprising:
   (1) obtaining a first integrated circuit structure comprising:
   a semiconductor substrate;
   one or more first conductive contact pads protruding out at a surface of the first integrated circuit structure;
   (2) obtaining a first substrate comprising a circuit which comprises one or more first conductive contact pads, wherein at least a portion of each of the one or more first contact pads of the first substrate is located in a corresponding via in a surface of the first substrate;
   (3) inserting the protruding first contact pads of the first integrated circuit structure into the corresponding vias of the first substrate and attaching the protruding first contact pads of the first integrated circuit structure to the first contact pads of the first substrate;
   wherein each first contact pad of the first substrate covers a bottom and entire sidewalls of the corresponding via.

16. A manufacturing method comprising:
   (1) obtaining a first integrated circuit structure comprising:
   a semiconductor substrate;
   one or more first conductive contact pads protruding out at a surface of the first integrated circuit structure;
   (2) obtaining a first substrate comprising a circuit which comprises one or more first conductive contact pads, wherein at least a portion of each of the one or more first contact pads of the first substrate is located in a corresponding via in a surface of the first substrate; p1
   (3) inserting the protruding first contact pads of the first integrated circuit structure into the corresponding vias of the first substrate and attaching the protruding first contact pads of the first integrated circuit structure to the first contact pads of the first substrate;
   (4) obtaining a second integrated circuit structure comprising:
   a semiconductor substrate;
   one or more first conductive contact pads protruding out at a surface of the second integrated circuit structure;
   wherein the first integrated circuit structure further comprises one or more second conductive contact pads, wherein at least a portion of each of the one or more second contact pads of the first integrated circuit structure is located in a corresponding via in a surface of the first integrated circuit structure;
   wherein the method further comprises:
   (5) inserting the protruding first contact pads of the second integrated circuit structure into the corresponding vias of the first integrated circuit structure and attaching the protruding first contact pads of the second integrated circuit structure to the second contact pads of the first integrated circuit structure.

17. The method of claim 16 wherein the first contact pads of the first integrated circuit structure are located on a first side of the first integrated circuit structure, and the second contact pads of the first integrated circuit structure are located on a second side of the first integrated circuit structure, the first side being opposite to the second side.

18. A manufacturing method comprising:
(1) obtaining a first integrated circuit structure comprising:
a semiconductor substrate;
one or more first conductive contact pads protruding out at a surface of the first integrated circuit structure;
(2) obtaining a first substrate comprising a circuit which comprises one or more first conductive contact pads, wherein at least a portion of each of the one or more first contact pads of the first substrate is located in a corresponding via in a surface of the first substrate;
(3) inserting the protruding first contact pads of the first integrated circuit structure into the corresponding vias of the first substrate and attaching the protruding first contact pads of the first integrated circuit structure to the first contact pads of the first substrate;
wherein each first contact pad of the first integrated circuit structure is provided by a conductor formed in a corresponding through via in the semiconductor substrate and protruding out of the through via.

19. The method of claim 18 wherein the first contact pads of the first integrated circuit structure protrude out at the surface which is opposite to an active surface of the first integrated circuit structure.

20. The method of claim 1 wherein in the operation (3) the first contact pads of the first integrated circuit structure are soldered to the first contact pads of the first substrate.

21. The method of claim 20 wherein in the operation (3) the first contact pads of the first integrated circuit structure are soldered to the second surfaces of the portions of the first contact pads of the first substrate.

22. The method of claim 1 wherein in the operation (3) the protruding first contact pads of the first integrated circuit structure are inserted into the corresponding vias deeper than at least tops of the second surfaces of portions of the first contact pads of the first substrate.

23. The method of claim 1 wherein the operation (2) comprises:

forming a dielectric layer which is part of the first substrate, wherein each said via is a via in the dielectric layer; and then
forming a conductive layer over the dielectric layer to provide at least said portions of the first contact pads of the first substrate.

24. A manufacturing method comprising:
(1) obtaining a first integrated circuit structure comprising:
a semiconductor substrate;
one or more first conductive contact pads protruding out at a surface of the first integrated circuit structure;
(2) obtaining a first substrate comprising a circuit which comprises one or more first conductive contact pads, wherein at least a portion of each of the one or more first contact pads of the first substrate is located in a corresponding via in a surface of the first substrate, wherein obtaining the first substrate comprises:
(2A) forming a dielectric layer which is part of the first substrate, wherein each said via is a via in the dielectric layer; and then
(2B) forming a conductive layer on a sidewall of each said via to provide at least a first portion of each first contact pad of the first substrate;
(3) inserting the protruding first contact pads of the first integrated circuit structure into the corresponding vias of the first substrate and attaching the protruding first contact pads of the first integrated circuit structure to the first contact pads of the first substrate.

25. The method of claim 24 wherein each first contact pad of the first substrate comprises a second portion formed before operation (2A).

26. The method of claim 24 wherein each first contact pad of the first substrate comprises a second portion underlying the dielectric layer.

27. The method of claim 24 wherein each first contact pad of the first substrate comprises a portion provided by said conductive layer on a bottom of the corresponding via.

* * * * *